(12) United States Patent
Chen

(10) Patent No.: US 11,201,213 B2
(45) Date of Patent: Dec. 14, 2021

(54) CHANNEL ALL-AROUND SEMICONDUCTOR DEVICE AND METHOD OF MANUFACTURING THE SAME

(71) Applicant: Powerchip Semiconductor Manufacturing Corporation, Hsinchu (TW)

(72) Inventor: Chun-Sheng Chen, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 217 days.

(21) Appl. No.: 16/575,409

(22) Filed: Sep. 19, 2019

(65) Prior Publication Data
US 2021/0020747 A1      Jan. 21, 2021

(30) Foreign Application Priority Data
Jul. 19, 2019   (TW) ................. 108125557

(51) Int. Cl.
| H01L 29/66 | (2006.01) |
| H01L 29/10 | (2006.01) |
| H01L 29/08 | (2006.01) |
| H01L 29/786 | (2006.01) |

(52) U.S. Cl.
CPC ...... *H01L 29/1037* (2013.01); *H01L 29/0847* (2013.01); *H01L 29/66666* (2013.01); *H01L 29/78642* (2013.01)

(58) Field of Classification Search
CPC ............... H01L 27/085; H01L 29/0653; H01L 29/1029; H01L 29/4238; H01L 29/42392; H01L 29/66409

USPC .......................................................... 257/213
See application file for complete search history.

(56) References Cited

U.S. PATENT DOCUMENTS

| 5,126,807 A | 6/1992 | Baba et al. |
| 8,823,090 B2 | 9/2014 | Bartley et al. |
| 9,123,802 B2 | 9/2015 | Mathur et al. |
| 2019/0348541 A1* | 11/2019 | Moroz ............... H01L 29/0673 |

FOREIGN PATENT DOCUMENTS

| EP | 0720234 | 7/1996 |
| JP | 2014007305 | 1/2014 |
| JP | 2016163049 | 9/2016 |

(Continued)

OTHER PUBLICATIONS

"Office Action of Taiwan Counterpart Application", dated Sep. 15, 2020, pp. 1-9.

(Continued)

*Primary Examiner* — Elias Ullah
(74) *Attorney, Agent, or Firm* — JCIPRNET

(57) ABSTRACT

A channel all-around semiconductor device and a method of manufacturing the same are provided. The semiconductor device includes a plurality of gate structures and a multi-connected channel layer. The gate structures have the same extension direction, and each of the gate structures has opposite first end and second end. The gate structures are all surrounded by the multi-connected channel layer, and the plane direction of the multi-connected channel layer is perpendicular to the above extension direction, so that the channels of the gate structures are connected to each other.

18 Claims, 21 Drawing Sheets

(56) References Cited

FOREIGN PATENT DOCUMENTS

| JP | 2016181534 | 10/2016 |
|----|-----------|---------|
| TW | 201829293 | 8/2018  |
| TW | 201906161 | 2/2019  |

OTHER PUBLICATIONS

"Office Action of Japan Counterpart Application", dated Mar. 30, 2021, p. 1-p. 4.

Felix Winkler, et al., "TSV Transistor—Vertical Metal Gate FET Inside a Through Silicon VIA", IEEE Electron Device Letters, vol. 39, No. 10, Oct. 2018, pp. 1493-1496.

Pablo Fernández-Martínez, et al., "A New Vertical JFET Power Device for Harsh Radiation Environments", Energies, vol. 10, Feb. 20, 2017, pp. 1-16.

Eunah Ko, et al., "Vertical Tunnel FET: Design Optimization With Triple Metal-Gate Layers", IEEE Transactions on Electron Devices, vol. 63, No. 12, Dec. 2016, pp. 5030-5035.

Anup Bhalla, et al., "The Outlook for SiC Vertical JFET Technology", Proceeding of The 1st IEEE Workshop on Wide Bandgap Power Devices and Applications, Oct. 2013, pp. 40-43.

* cited by examiner

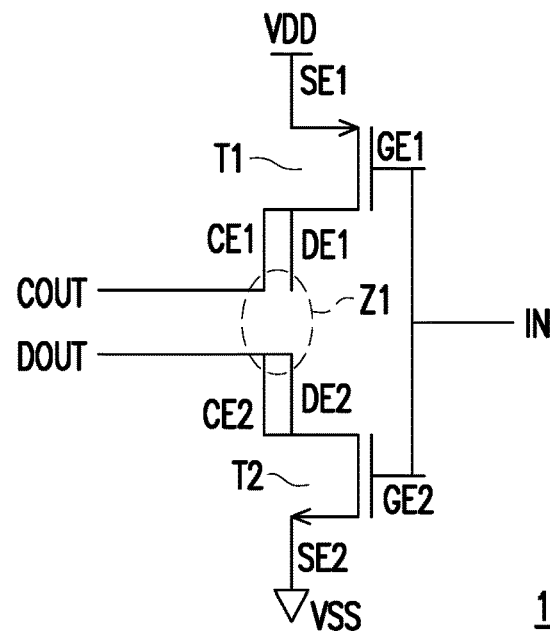
FIG. 18A
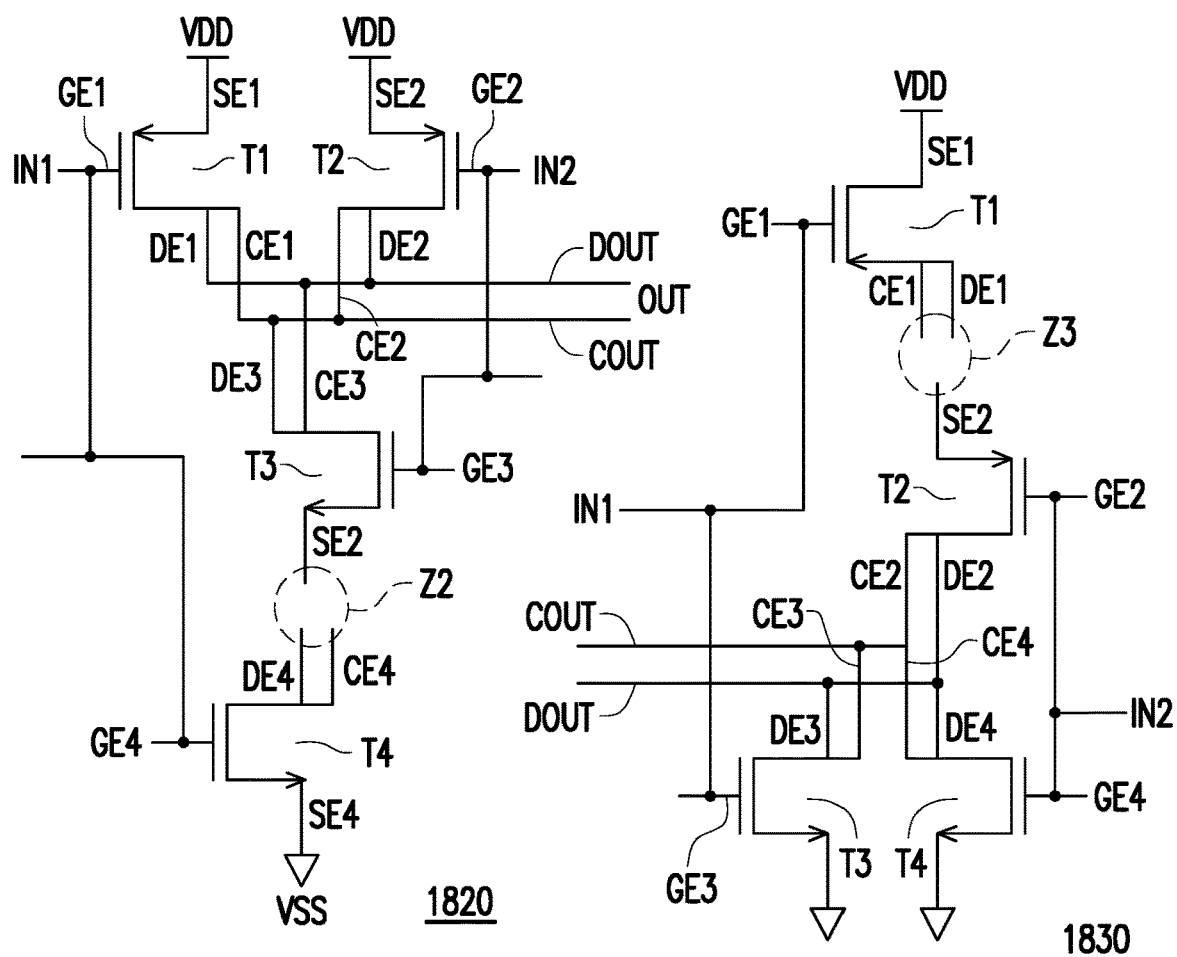
FIG. 18B
FIG. 18C

CHANNEL ALL-AROUND SEMICONDUCTOR DEVICE AND METHOD OF MANUFACTURING THE SAME

CROSS-REFERENCE TO RELATED APPLICATION

This application claims the priority benefit of Taiwan application serial no. 108125557, filed on Jul. 19, 2019. The entirety of the above-mentioned patent application is hereby incorporated by reference herein and made a part of this specification.

BACKGROUND

Technical Field

The disclosure relates to a semiconductor technology, and particularly relates to a channel all-around semiconductor device and a method of manufacturing the same.

Description of Related Art

Metal-Oxide-Semiconductor Field-Effect Transistor (MOSFET) micromation continuously promotes progress of electronic industry. From a structural point of view, an evolution path of the MOSFET is from planar to finfet to nanowire, where the nanowire has various deformations such as a Gate All-Around (GAA) field-effect transistor.

A purpose of the GAA field-effect transistor is to use ballistic transport to improve carrier mobility, and reduce a sub-threshold swing to increase an output current per unit area.

However, the GAA field-effect transistor has a gate closed channel structure, so that the field-effect thereof is contributed by a single gate, and when multiple GAA field-effect transistors are electrically connected in parallel or arranged side-by-side in structure, a potential of any point in the channel is still contributed by a single gate.

SUMMARY

The disclosure is directed to a channel all-around (CAA) semiconductor device. The output current per unit area of the device can be greatly increased under the same sub-threshold swing.

The present disclosure is also directed to a method of manufacturing the channel all-around semiconductor device. The method can be used for manufacturing a multi-connected channel all-around (CAA) semiconductor device.

The channel all-around semiconductor device of the disclosure includes a plurality of gate structures and a multi-connected channel layer. The gate structures have the same extension direction, and each of the gate structures has opposite first end and second end. The gate structures are all surrounded by the multi-connected channel layer, and a plane direction of the multi-connected channel layer is perpendicular to the above extension direction, so that channels of the gate structures are (electrically) connected to each other.

The method of manufacturing the semiconductor device of the disclosure includes: forming a plurality of gate structures, and forming a multi-connected channel layer on a substrate. The gate structures have the same extension direction, and each of the gate structures has opposite first end and second end. The gate structures are all surrounded by the formed multi-connected channel layer, and a plane direction of the multi-connected channel layer is perpendicular to the extension direction of the gate structures, so that channels of the gate structures are connected to each other.

Based on the above, by means of the design of the channel all-around semiconductor device, the output current per unit area of the device can be greatly increased under the same sub-threshold swing. Therefore, the device is expected to be applied to various semiconductor devices and to further increase the density of devices.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 18A to FIG. 18C are schematic diagrams of a plurality of implementations of a circuit structure according to an embodiment of the disclosure.

DESCRIPTION OF THE EMBODIMENTS

The following makes detailed description by listing embodiments and with reference to accompanying drawings, but the provided embodiments are not intended to limit the scope covered by the present disclosure. In addition, the drawings are drawn only for the purpose of description, and are not drawn according to original sizes. For ease of understanding, same elements in the following description are described by using same signs. Terms such as "includes", "comprises", and "having" used herein are all inclusive terms, namely, mean "includes but not limited to". In addition, the directional terms mentioned herein, like "above" and "below", refer to the directions in the appended drawings. Therefore, the directional terms are only used for illustration instead of limiting the present disclosure.

Figure 1:
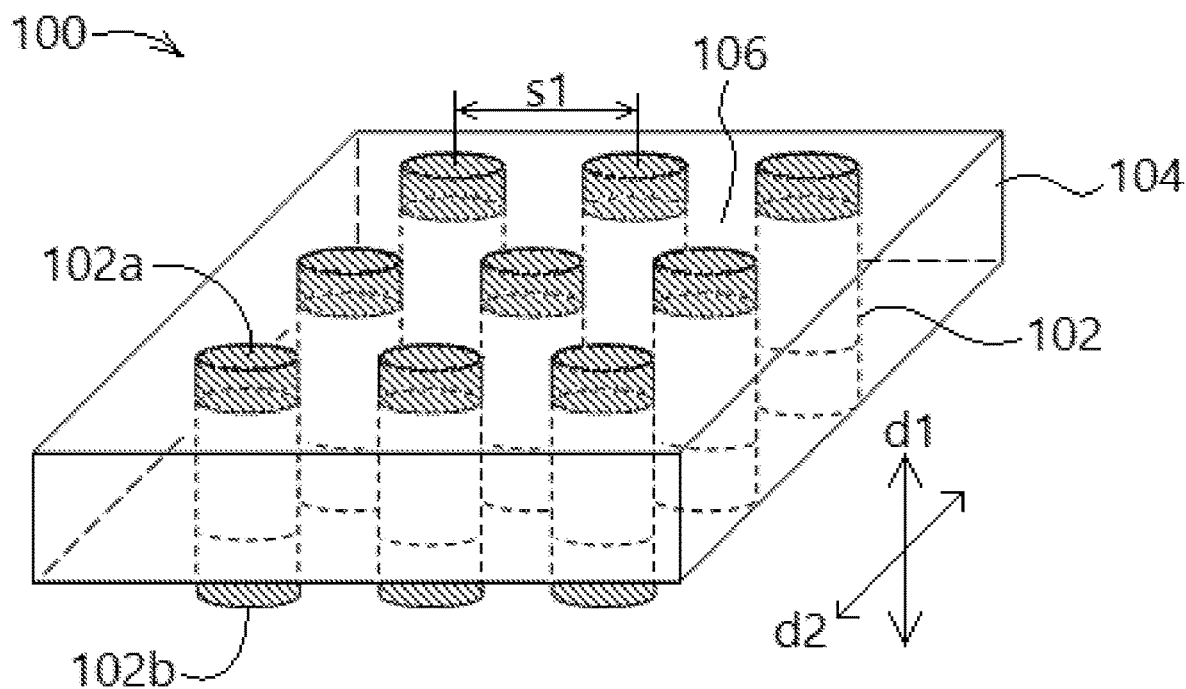
FIG. 1 is a perspective view of a channel all-around (CAA) semiconductor device according to a first embodiment of the disclosure.

FIG. 1 is a perspective view of a channel all-around (CAA) semiconductor device according to a first embodiment of the disclosure.

Referring to FIG. 1, a channel all-around semiconductor device 100 of the first embodiment includes a plurality of gate structures 102 and a multi-connected channel layer 104. The gate structures 102 have an extension direction d1, and each of the gate structures 102 has a first end 102a and a second end 102b opposite to each other. The multi-connected channel layer 104 fully surrounds the gate structures 102, and a plane direction d2 of the multi-connected channel layer 104 is perpendicular to the extension direction d1, so that channels 106 of the gate structures 102 are all (electrically) connected. The term "multi-connected" of the disclosure refers to that in the channels 106 of the single channel all-around semiconductor device 100, there may be any virtual closed path (a curve) where no loops can be contracted to a point in three-dimensional geometry. In view of an electrical characteristic, the so-called "multi-connected channel" may also be expressed as an electrical conduction channel connecting two or more terminals. In an embodiment, a spacing s1 between two adjacent gate structures 102 is, for example, smaller than a distance between the first end 102a and the second end 102b of each of the gate structures 102, and the spacing s1 is a distance between two adjacent gate structures 102 perpendicular to the extension directions d1. A cross section of the gate structure 102 of FIG. 1 has a round shape or an ellipse shape, but the disclosure is not limited thereto, and the cross section of the gate structure 102 may also be a rectangle, a cross shape, a polygon or an irregular shape, and the cross section is perpendicular to the extension direction d1.

Figure 2:
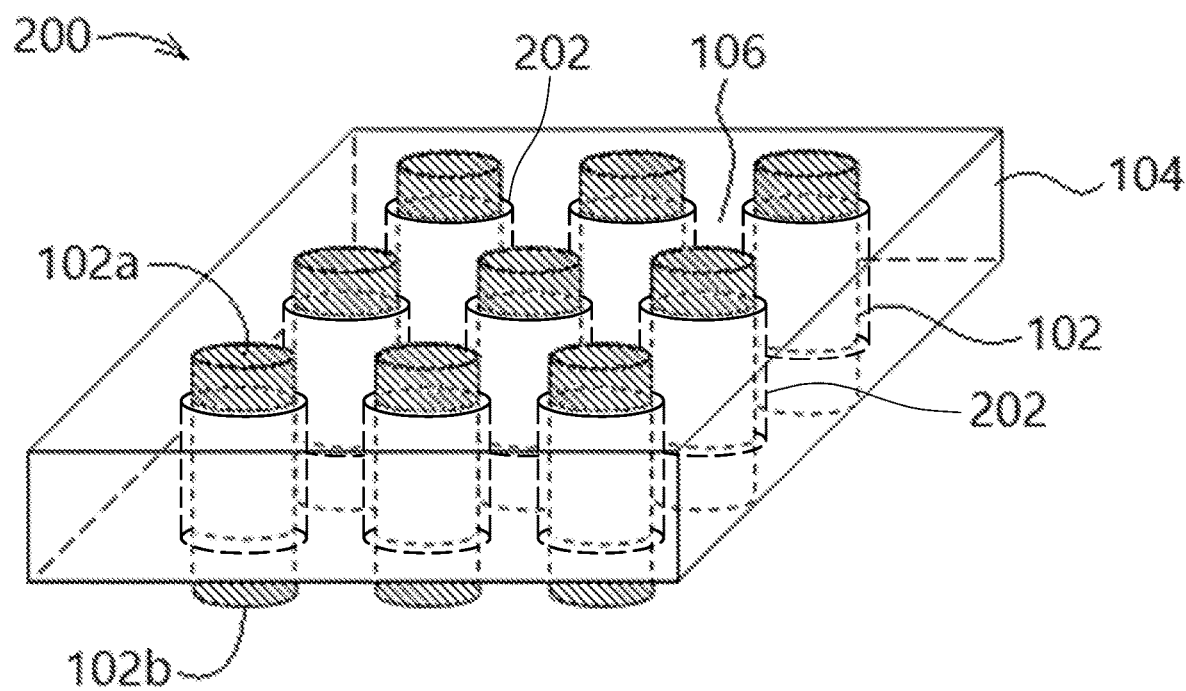
FIG. 2 is a perspective view of a Metal-Insulator-Semiconductor Capacitor (MISC) according to a second embodiment of the disclosure.

FIG. 2 is a perspective view of a Metal-Insulator-Semiconductor Capacitor (MISC) according to a second embodiment of the disclosure, where the same reference numbers as the first embodiment are used to represent the same or similar components, and description of the same component may refer to the first embodiment, which is not repeated.

Referring to FIG. 2, the semiconductor device of the second embodiment is the MISC 200, and besides the gate structures 102 and the multi-connected channel layer 104, a dielectric layer 202 is further configured between each of the gate structures 102 and the multi-connected channel layer 104, where a material of the dielectric layer 202 is, for example, an oxide or other dielectric material suitable for the capacitor.

Figure 3:
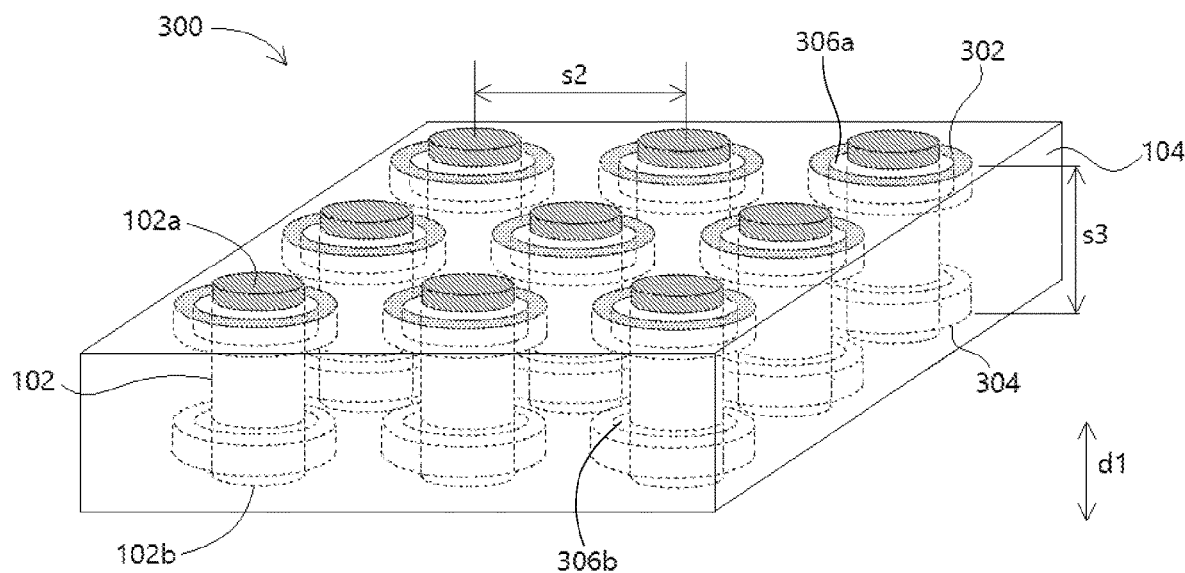
FIG. 3 is a perspective view of a Field-Effect Transistor (FET) according to a third embodiment of the disclosure.

FIG. 3 is a perspective view of a Field-Effect Transistor (FET) according to a third embodiment of the disclosure, where the same reference numbers as the first embodiment are used to represent the same or similar components, and description of the same component may refer to the first embodiment, which is not repeated.

Referring to FIG. 3, the semiconductor device of the third embodiment is the FET 300, and besides the gate structures 102 and the multi-connected channel layer 104, the FET 300 further includes source regions 302, drain regions 304 and a plurality of insulating spacers 306a and 306b. Each of the source regions 302 surrounds the first end 102a of each of the gate structures 102, and each of the drain regions 304 surrounds the second end 102b of each of the gate structures 102. The insulating spacers 306a are disposed between the source regions 302 and the gate structures 102, and the insulating spacers 306b are disposed between the drain regions 304 and the gate structures 102. An effect of the insulating spacers 306a and 306b is to prevent short circuit between the gate structures 102 and the source regions 302 and between the gate structures 102 and the drain regions 304, so that the insulating spacers 306a and 306b are made of an insulating material, for example, oxide or other insulating material. Due to channel carriers of the FET 300 are not confined by the gate structures 102, there are multiple current path (from the drain regions 304 to the source regions 302) formed by the extra degree of freedom in 3D space. The multiple current paths include paths along the extension direction d1, paths perpendicular to the extension direction d1, and paths first along the extension direction d1 and then changed to be perpendicular to the extension direction d1. A spacing s2 between any two adjacent gate structures 102 may be set within twice of a distance s3 between the source region 302 and the drain region 304, and the spacing s2 is a distance between two adjacent gate structures 102 perpendicular to the extension directions d1. When the spacing s2 of the gate structures 102 is within the above range, it is more advantageous to generate a multi-connected channel in the multi-connected channel layer 104.

Referring to FIG. 3, a potential of any point in the multi-connected channel layer 104 of the FET 300 is a superimposition (scalar sum) of individual potentials of the gate structures 102. If the individual potential of the $i^{th}$ gate structure 102 is Qi/Ri, a total potential of the multi-connected channel is $$Q_1/R_1 + Q_2R_2 + Q_3R_3 + Q_4/R_4 + Q_5/R_5 + \ldots = \sum_{i=1}^{n} \frac{Qi}{Ri}.$$

At a certain point in the multi-connected channel, a distance between such point and the $P^{th}$ gate structure 102 is Rp, and the potential of such gate structure 102 is Qp/Rp. If a following formula is satisfied, a gate control ability of the EFT 300 is estimated to be superior to that of a single Channel All-Around (CAA) FET.

$$\sum_{i=1, i\neq p}^{n} \frac{Qi}{Ri} \geq \frac{Qp}{Rp}.$$

Particularly, when the two sides of the above formula are equal, it is equivalent to a sum of the potentials of double gates. Namely, only considering a potential distribution of the gates and ignoring a shielding effect of the carriers, the FET 300 with the multi-connected channel of the disclosure is superior to the FET of two gates (for example, a structure that the SOI MOSFET includes a front gate and a back gate). Moreover, since as a gate size becomes smaller (R is also smaller), 1/R increases rapidly, the disclosure may achieve a bigger total potential through the smaller gate size in collaboration with more gate structures.

In an embodiment, if the gate structures 102 and the multi-connected channel layer 104 form a P-N junction, the FET 300 may be a Junction Field-Effect Transistor (JFET).

In an embodiment, if the gate structures 102 and the multi-connected channel layer 104 form a metal semiconductor contact, the FET 300 may be a Metal-Semiconductor Field-Effect Transistor (MESFET).

In an embodiment, if there is a heterostructure (not shown) between the gate structures 102 and the multi-connected channel layer 104, the FET 300 may be a Heterostructure Isolated Gate FET (HIGFET), where the heterostructure is an undoped heterostructure. Alternatively, the FET 300 may be a Modulation-Doped FET (MODFET), where the heterostructure is a modulation-doped heterostructure.

If the gate structures 102 belong to different devices, the gate structures of different devices may be blocked by current or potential. Alternatively, a general device isolation structure such as a Shallow Trench Isolation (STI) structure or a Deep Trench Isolation (DTI) structure is directly disposed between different devices.

Figure 4:
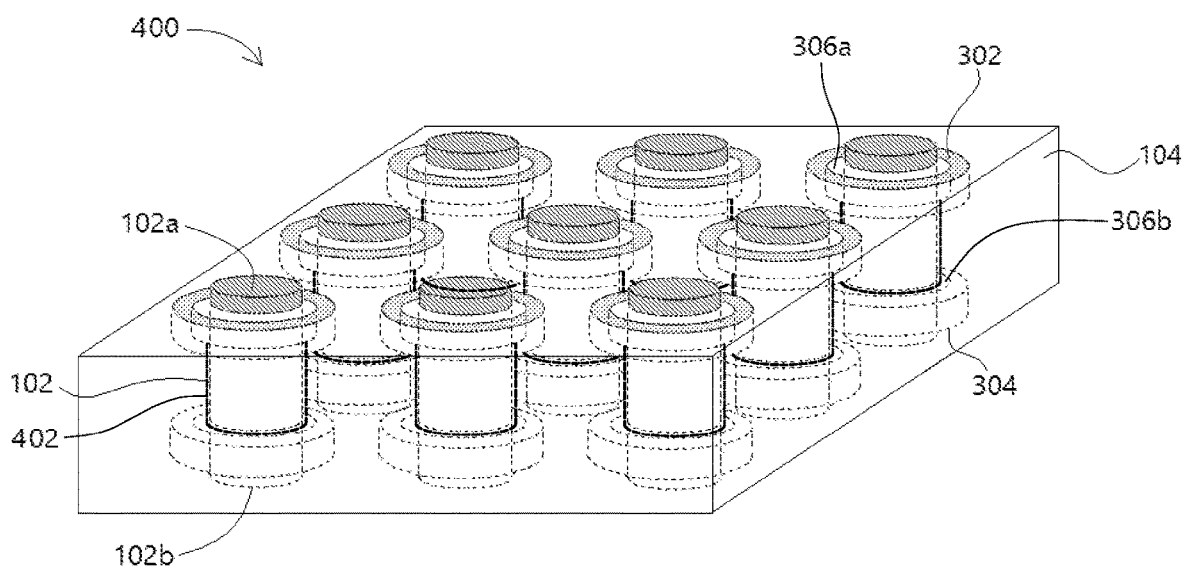
FIG. 4 is a perspective view of a Metal-Insulator-Semiconductor FET (MISFET) according to a fourth embodiment of the disclosure.

FIG. 4 is a perspective view of a Metal-Insulator-Semiconductor FET (MISFET) according to a fourth embodiment of the disclosure, where the same reference numbers as the third embodiment are used to represent the same or similar components, and description of the same component may refer to the third embodiment, which is not repeated.

Referring to FIG. 4, the semiconductor device of the fourth embodiment is the MISFET 400, and besides the gate structures 102, the multi-connected channel layer 104, the source regions 302, the drain regions 304 and the insulating spacers 306a and 306b, the MISFET 400 further includes a gate insulating layer 402 disposed between each of the gate structures 102 and the multi-connected channel layer 104, where a material of the gate insulating layer 402 is, for example, silicon oxide. In FIG. 4, a thickness of the insulating spacers 306a and 306b is greater than a thickness of the gate insulating layer 402, but the disclosure is not limited thereto. The thickness of the insulating spacers 306a and 306b may also be equal to the thickness of the gate insulating layer 402. Moreover, when the material and the thickness of the insulating spacers 306a and 306b and the gate insulating layer 402 are the same, it can simplify the process so as to simultaneously fabricate the insulating spacers 306a and 306b and the gate insulating layer 402.

Figure 5:
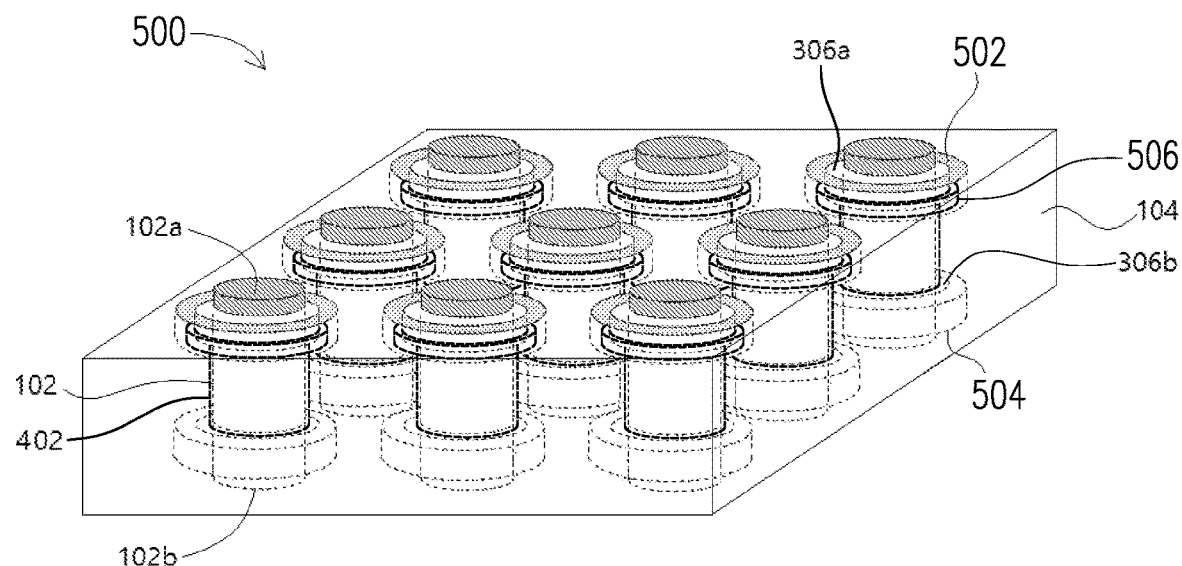
FIG. 5 is a perspective view of a Tunnel FET (TFET) according to a fifth embodiment of the disclosure.

FIG. 5 is a perspective view of a Tunnel FET (TFET) according to a fifth embodiment of the disclosure, where the same reference numbers as the fourth embodiment are used to represent the same or similar components, and description of the same component may refer to the fourth embodiment, which is not repeated.

Referring to FIG. 5, the semiconductor device of the fifth embodiment is the TFET 500, and besides the gate structures 102, the multi-connected channel layer 104, the source regions 502, the drain regions 504, the insulating spacers 306a and 306b, and the gate insulating layer 402, the MISFET 500 further includes a pocket doped region 506 disposed in the source region 502 and surrounding each of the gate structures. In the embodiment, the source region 502 and the drain region 504 have different conductive types, and the pocket doped region 506 and the source region 502 have different conductive types. Namely, the pocket doped region 506 and the drain region 504 have the same conductive type. For example, the source region 502 is an N+ region, the drain region 504 is a P+ region, and the pocket doped region 506 is the P+ region. The P+ type pocket doped region 506 and the N+ type source region 502 may produce a high electric field nearby to cause a Band-to-Band tunneling current (BTBT current).

Figure 6:
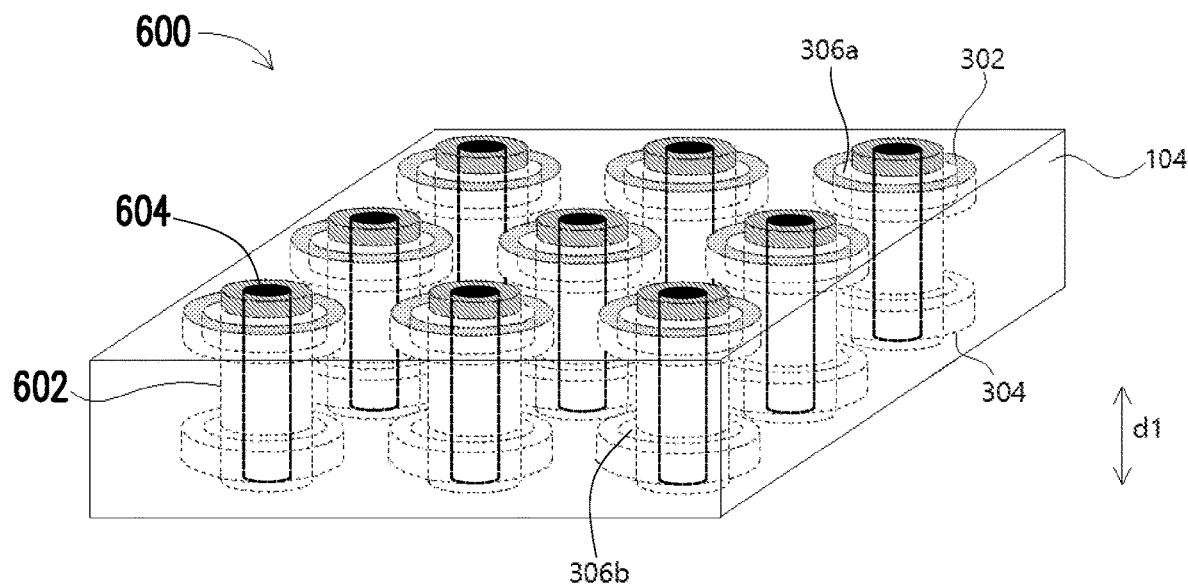
FIG. 6 is a perspective view of a Gate-Channel All-Around (GCAA) FET according to a sixth embodiment of the disclosure.

FIG. 6 is a perspective view of a Gate-Channel All-Around (GCAA) FET according to a sixth embodiment of the disclosure, where the same reference numbers as the third embodiment are used to represent the same or similar components, and description of the same component may refer to the third embodiment, which is not repeated.

Referring to FIG. 6, the semiconductor device of the sixth embodiment is the GCAA FET 600, and besides the multi-connected channel layer 104, the source regions 302, the drain regions 304 and the insulating spacers 306a and 306b, each of the gate structures 602 is a hollow structure, and an internal closed channel structure 604 is formed in the hollow region of each of the gate structures 602. Therefore, the semiconductor device of the sixth embodiment simultaneously has an internal closed channel and the external multi-connected channel.

Figure 7:
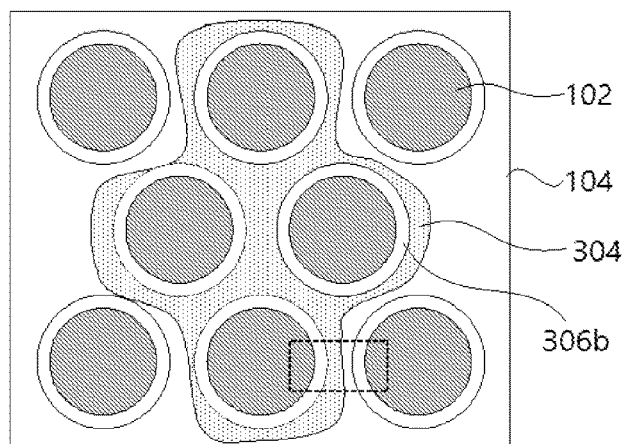
FIG. 7 is a top view of a FET according to a seventh embodiment of the disclosure.

FIG. 7 is a top view of a FET according to a seventh embodiment of the disclosure, where the same reference numbers as the third embodiment are used to represent the same or similar components, and description of the same component may refer to the third embodiment, which is not repeated.

In FIG. 7, an area of a cross section of the drain region 304 is smaller than an area of a plane of the multi-connected channel layer 104, where the aforementioned cross section is perpendicular to the extension direction (d1 of FIG. 3). Since the cross section of the drain region 304 is smaller, channels in the multi-connected channel layer 104 are controlled to suppress a leakage path. Moreover, a region encircled by dotted lines of FIG. 7 may form a Meal-Insulator-Semiconductor-Insulator-Metal (MISIM) diode structure.

Figure 8A:
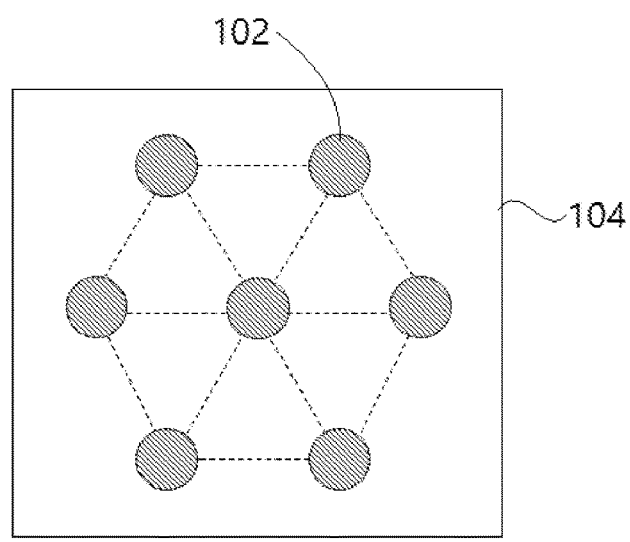
FIG. 8A and FIG. 8B are top views of two CAA semiconductor devices according to an eighth embodiment of the disclosure.
Figure 8B:
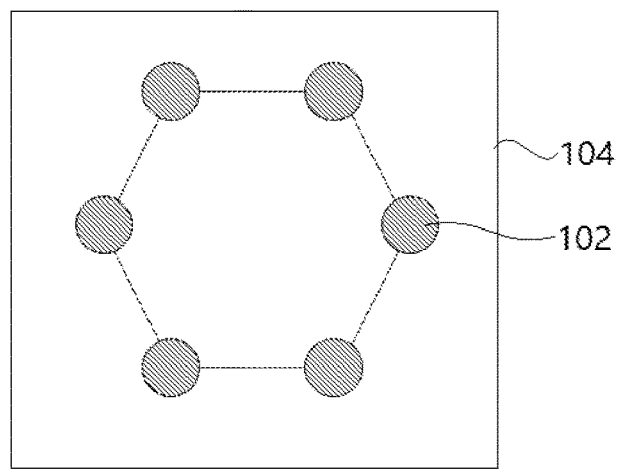
Figure 8C:
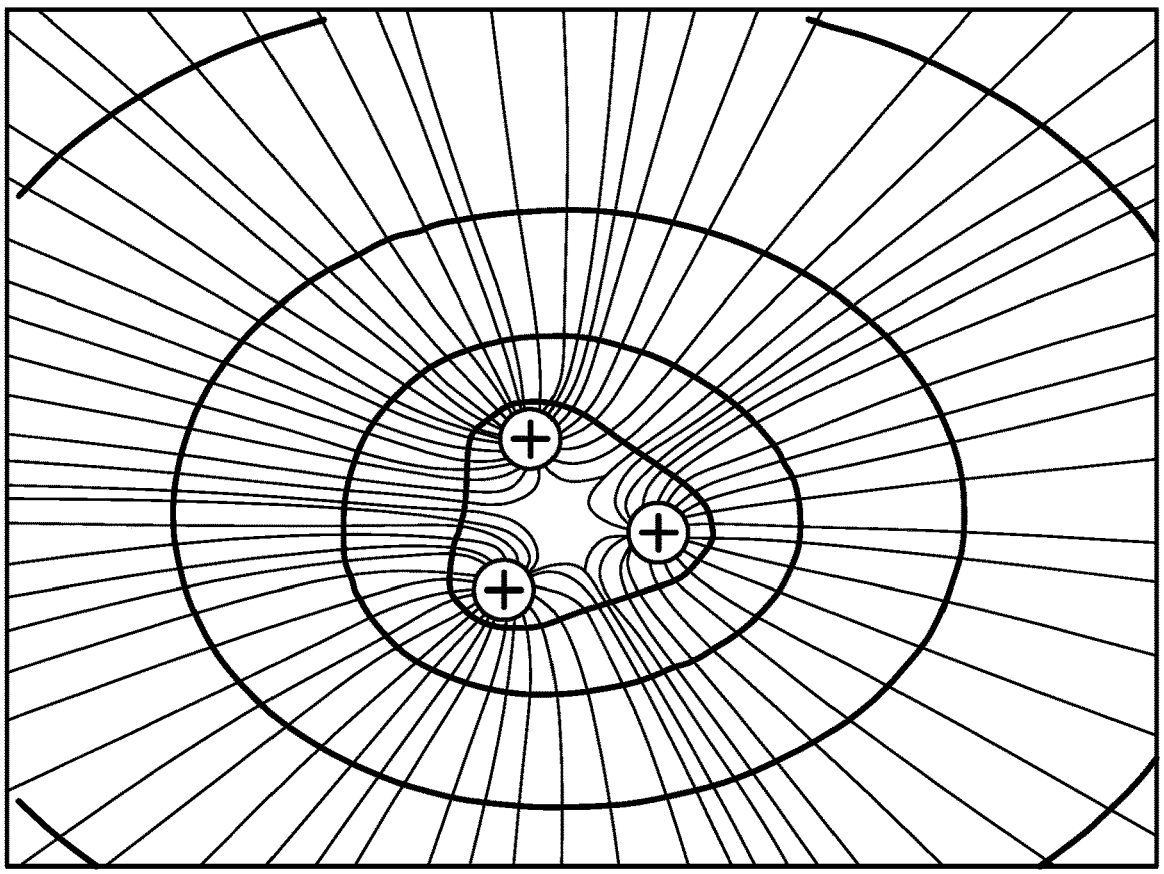
FIG. 8C is a potential-electric field diagram of FIG. 8A.

FIG. 8A and FIG. 8B are top views of two CAA semiconductor devices according to an eighth embodiment of the disclosure, where the same reference numbers as the first embodiment are used to represent the same or similar components, and description of the same component may refer to the first embodiment, which is not repeated. In the disclosure, arrangement of the gate structures 102 in a plane direction may be paired arrangement, regular arrangement or irregular arrangement. For example, the arrangement of the gate structures 102 of the first embodiment in the plane direction is a regular quadrilateral arrangement, and in the eighth embodiment, the arrangement of the gate structures 102 in the plane direction is a triangular arrangement (shown in FIG. 8A) or hexagonal arrangement (shown in FIG. 8B), but the disclosure also has other choices, for example, a pentagonal arrangement, etc. According to a simulated potential-electric field diagram of FIG. 8C, it can be seen that electric field lines of the same potential are perpendicular to potential lines, and if an intensity of the electric field is enough to form the channel, equipotential lines of multiple identical potential gates may also embody the meaning of multi-connected channel, thus achieving the effect of multi-connected channel. Therefore, the aforementioned arrangement is also adapted to other embodiments.

Figure 9:
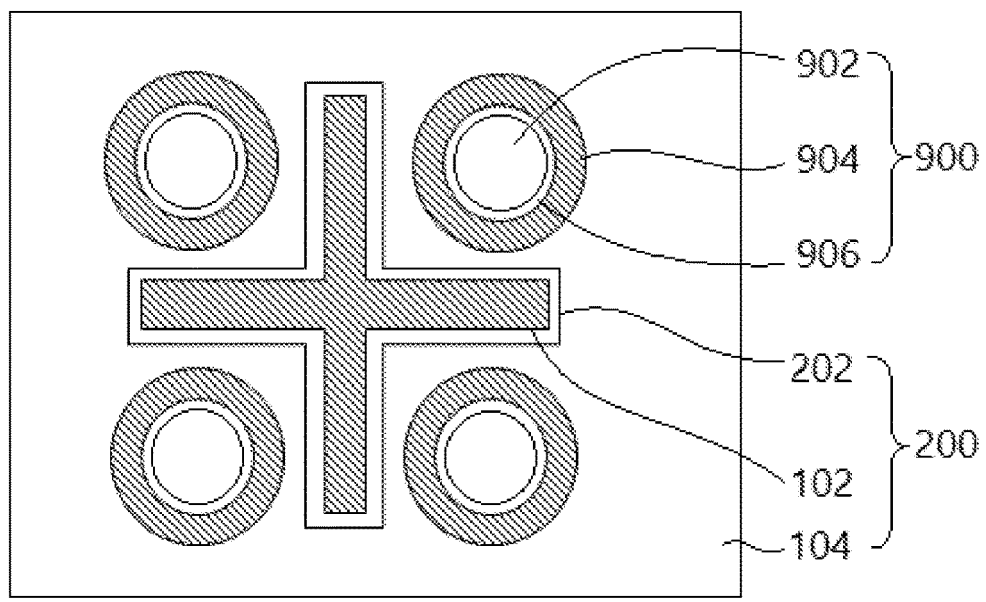
FIG. 9 is a top view of a CAA semiconductor device according to a ninth embodiment of the disclosure.

FIG. 9 is a top view of a CAA semiconductor device according to a ninth embodiment of the disclosure, where the same reference numbers as the second embodiment are used to represent the same or similar components, and description of the same component may refer to the second embodiment, which is not repeated.

In the ninth embodiment, the semiconductor device of the second embodiment further includes at least one Gate All-Around (GAA) element 900, for example, the semiconductor device of FIG. 9 is composed of one cross type MISC 200 and four GAA elements 900, and an extension direction of the GAA elements 900 is the same with an extension direction of the gate structure 102. The GAA element 900 basically includes a closed channel 902, an external gate 904 and a dielectric layer 906 there between. However, the disclosure is not limited thereto, and the MISC 200 may also be changed to the semiconductor device of other embodiment, where the number, a cross section shape, etc., of the GAA element 900 and the semiconductor device may all be changed according to an actual requirement.

Figure 10A:
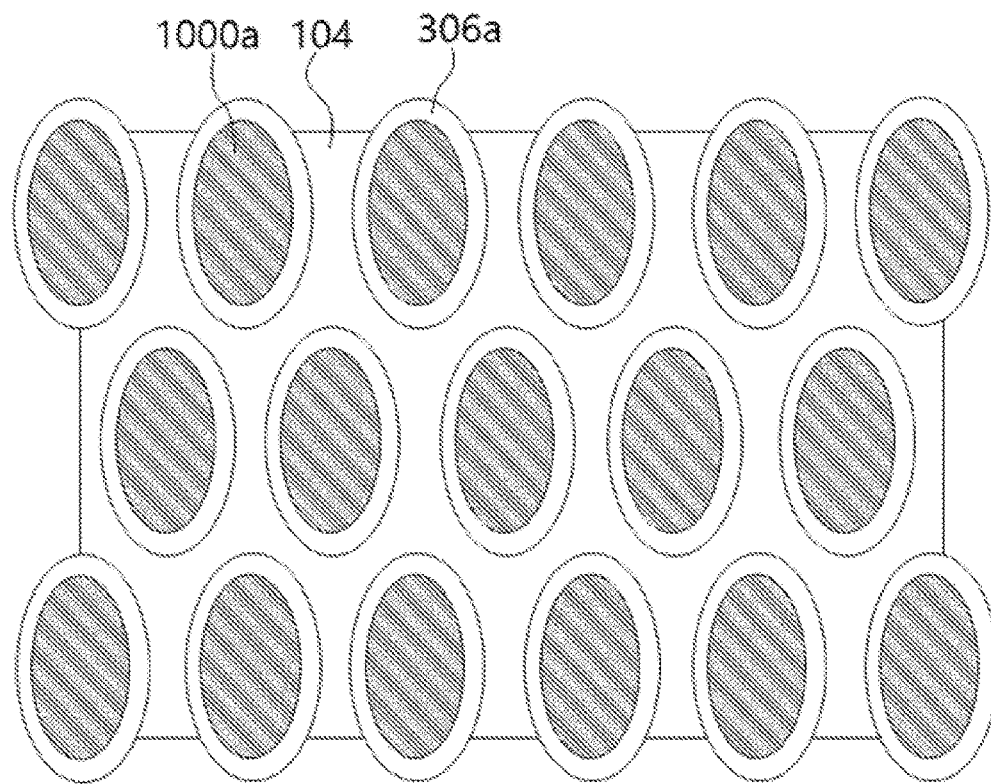
FIG. 10A and FIG. 10B are top views of two FETs according to a tenth embodiment of the disclosure
Figure 10B:
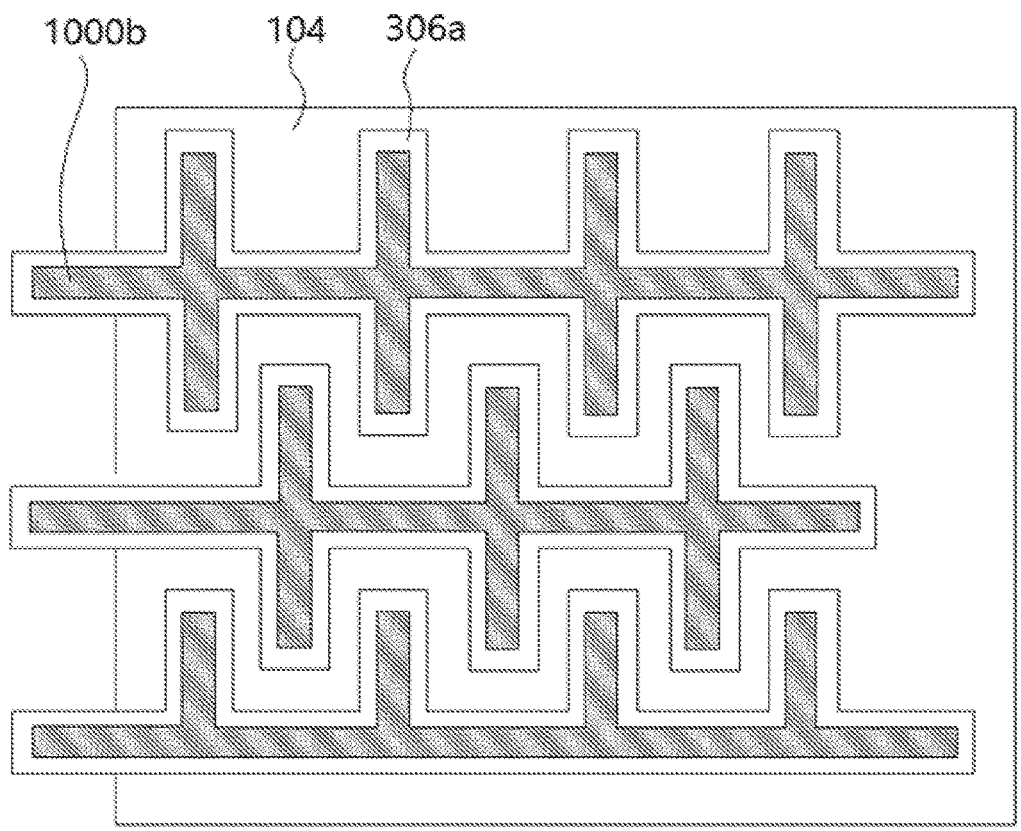

FIG. 10A and FIG. 10B are top views of two FETs according to a tenth embodiment of the disclosure, where the same reference numbers as the third embodiment are used to represent the same or similar components, and illustration of the drain region and the source region are omitted, and description of the same component may refer to the third embodiment, which is not repeated.

In FIG. 10A and FIG. 10B, a portion of gate structures 1000a, 1000b extends along a plane direction out of the multi-connected channel layer 104, so that a range capable of generating the multi-connected channel is smaller than a range of the gate structures 1000a, 1000b, and channels in the multi-connected channel layer 104 are all controlled to suppress the leakage path. Moreover, although other structures outside the multi-connected channel layer 104 are not illustrated, it should be noted that the multi-connected channel layer 104 may be surrounded by a device isolation structure (not shown) and electrically isolated from other surrounding devices.

FIG. 11A to FIG. 11E are cross-sectional view of a manufacturing flow of a CAA semiconductor device according to an eleventh embodiment of the disclosure.

Figure 11A:
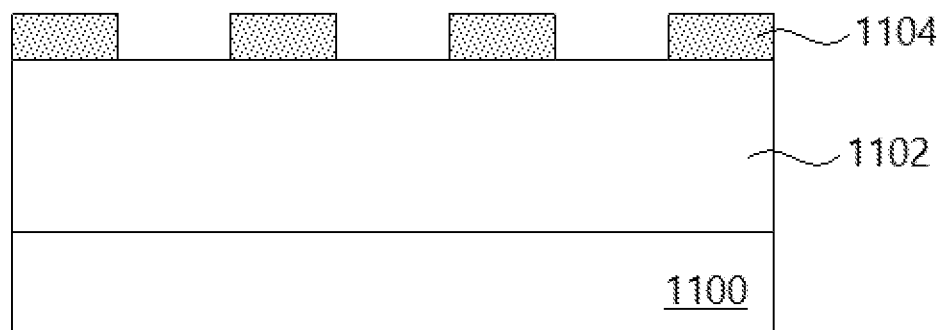
FIG. 11A to FIG. 11E are cross-sectional view of a manufacturing flow of a CAA semiconductor device according to an eleventh embodiment of the disclosure.

Referring to FIG. 11A, a multi-connected channel layer 1102 is first formed on a substrate 1100, and a method of forming the multi-connected channel layer 1102 is, for example, to perform an epitaxial process on the substrate 1100. Moreover, to facilitate a subsequent etching process, a mask layer 1104 is first formed on the multi-connected channel layer 1102, where the mask layer 1104 may be a single-layer or multi-layer structure.

Figure 11B:
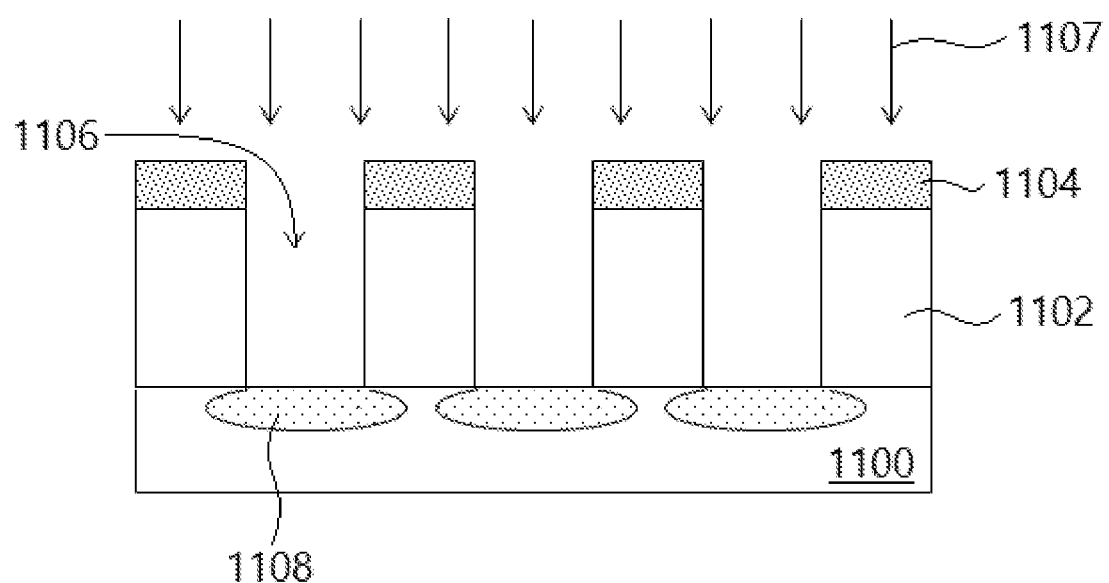

Then, referring to FIG. 11B, a plurality of gate holes 1106 are formed in the multi-connected channel layer 1102, and the gate holes 1106 have a same extension direction to make the subsequently formed gate structures to have the same extension direction. After the gate holes 1106 are formed, a doping process 1107 may be performed according to a device design, so as to form source regions 1108 in the substrate 1100 in the gate holes 1106.

Figure 11C:
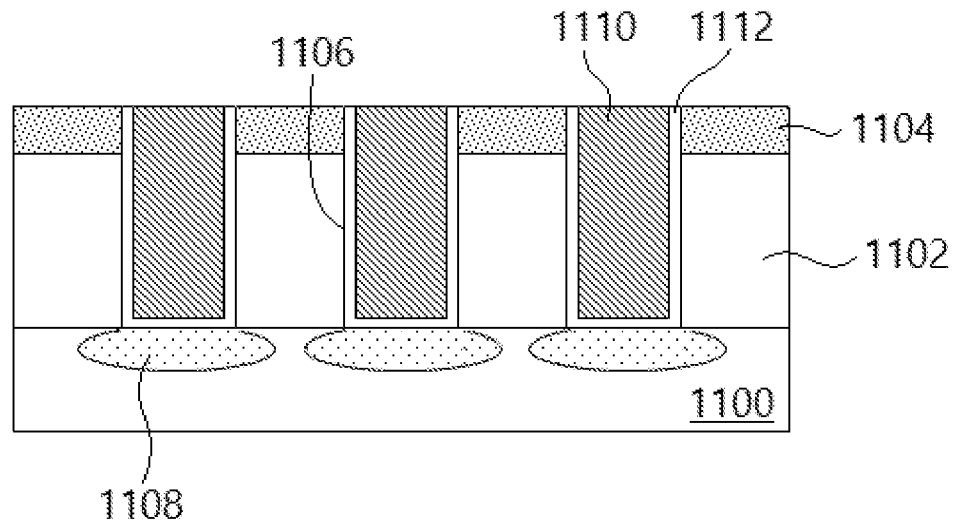

Then, referring to FIG. 11C, a conductive material 1110 is filled in the gate holes 1106, and the conductive material 1110 is planarized to remove the conductive material outside the gate holes 1106. Moreover, in order to form different semiconductor devices, other film layer 1112 (for example, a dielectric layer, an insulating spacer or a heterostructure) may be first conformally formed on inner surfaces of the gate holes 1106, and then deposition and planarization of the conductive material 1110 are performed.

Figure 11D:
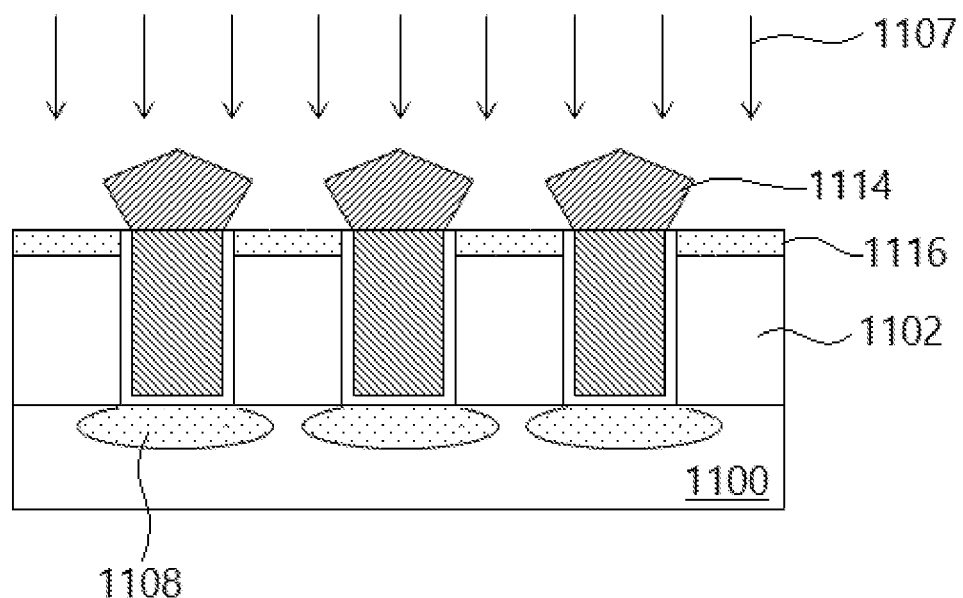

Then, referring to FIG. 11D, after the mask layer 1104 is removed, re-crystallization or selective epitaxy may be carried out to form the gate structures 1114. The multi-connected channel layer 1102 fully surrounds the gate structures 1114, and a plane direction of the multi-connected channel layer 1102 is perpendicular to the extension direction of the gate structures 1114, such that the channels of the gates structures 1114 are (electrically) connected. The doping process 1107 may be performed according to a device design after the gate structures 1114 are formed, so as to form drain region 1116 on a surface of the multi-connected channel layer 1102.

Figure 11E:
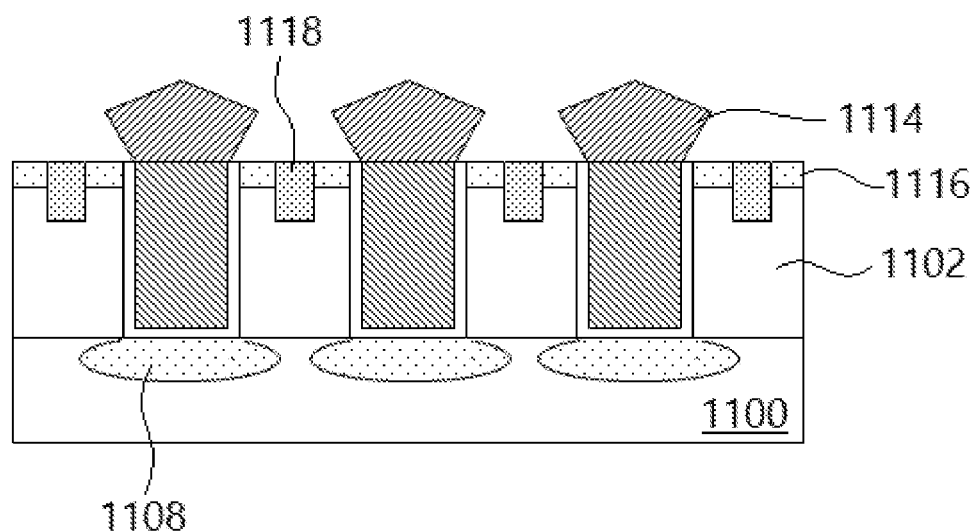

Finally, referring to FIG. 11E, isolation structures 1118 may be formed between the drain regions 1116 to separate the drain regions 1116 of different gate structures 1114. The isolation structures 1118 are, for example, shallow trench isolation structures or other isolation structures.

FIG. 12A to FIG. 12E are cross-sectional views of a manufacturing flow of a CAA semiconductor device according to a twelfth embodiment of the disclosure.

Figure 12A:
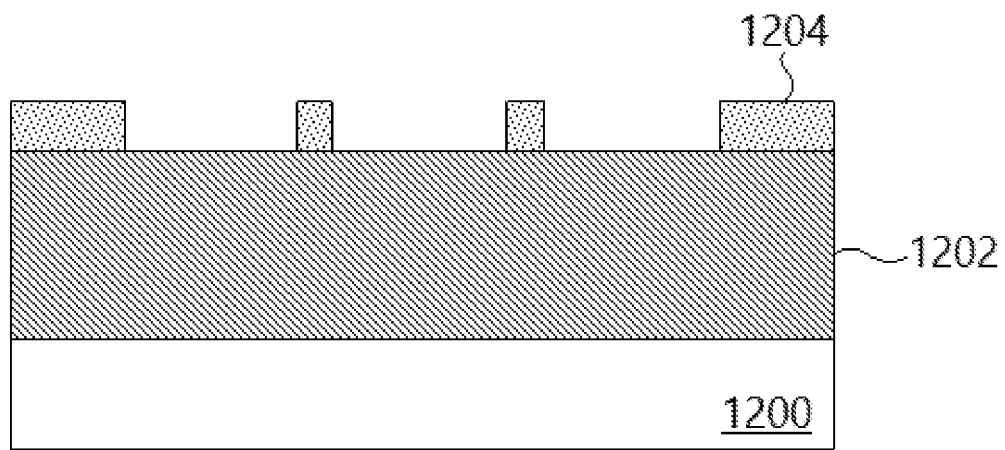
FIG. 12A to FIG. 12E are cross-sectional views of a manufacturing flow of a CAA semiconductor device according to a twelfth embodiment of the disclosure.

Referring to FIG. 12A, a conductive material 1202 is first formed on a substrate 1200, and a method of forming the conductive material 1202 is, for example, to perform an epitaxial process on the substrate 1200. Moreover, to facilitate a subsequent etching process, a mask layer 1204 is first formed on the conductive material 1202, where the mask layer 1204 may be a single-layer or multi-layer structure.

Figure 12B:
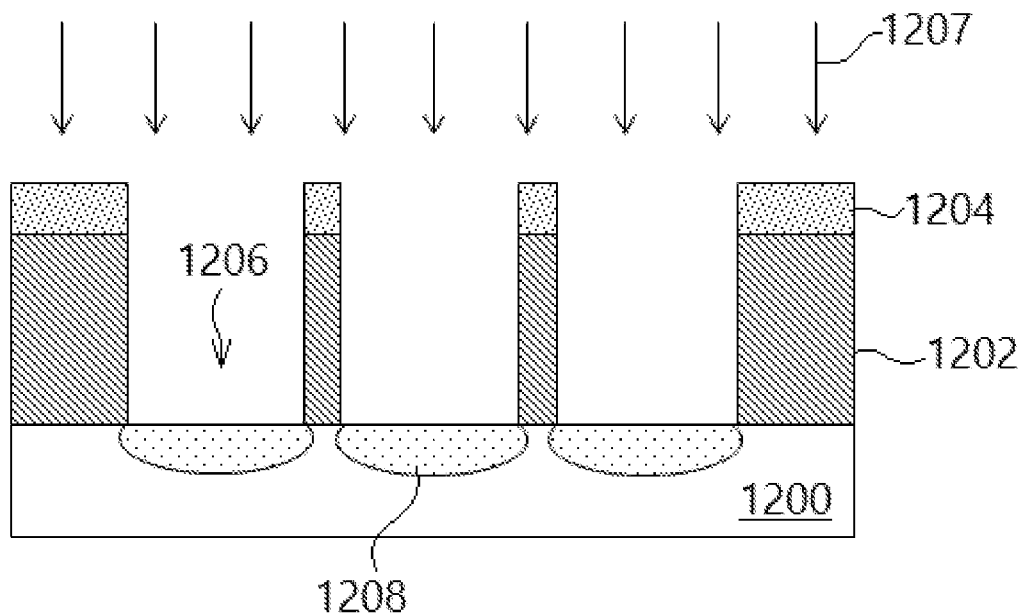

Then, referring to FIG. 12B, a connected trench 1206 is formed in the conductive material 1202. Since FIG. 12B is a cross-sectional view diagram, the connected trench 1206 is a plurality of separated regions, but in fact, the connected trench 1206 has a position the same with that of the multi-connected channel layer 104 of FIG. 1 and the separated regions are connected as a whole. A doping process 1207 may be performed according to a device design after the connected trench 1206 is formed, so as to form source regions 1208 in the substrate 1200 in the connected trench 1206.

Figure 12C:
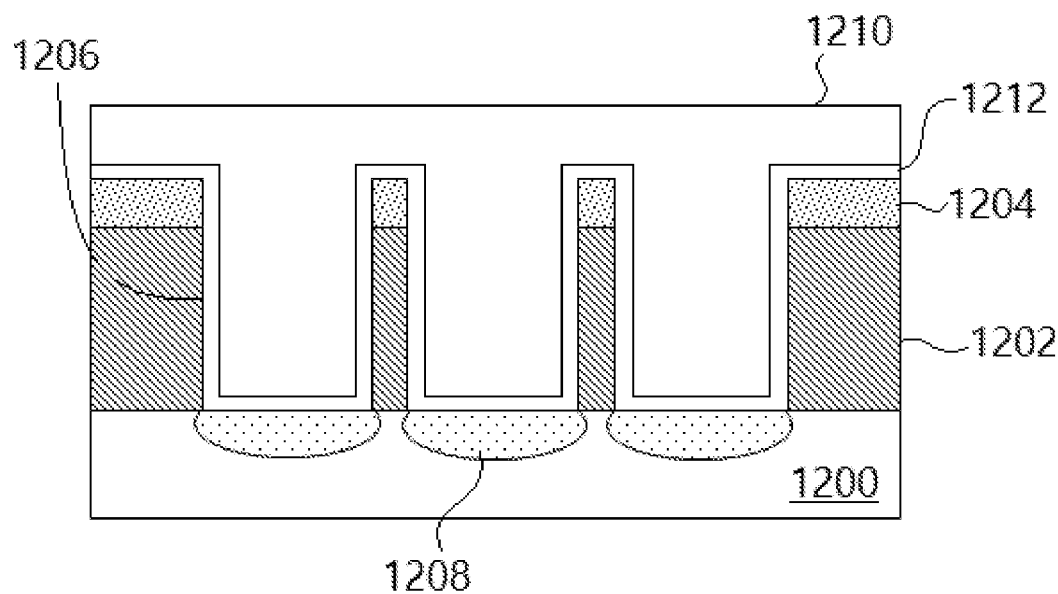

Then, referring to FIG. 12C, a channel material 1210 is formed in the connected trench 1206. In an embodiment, before the channel material 1210 is formed, other film layer 1212 (for example, a dielectric layer, an insulating spacer or a heterostructure) may be first conformally deposited in the connected trench 1206. The channel material 1210 is, for example, an epitaxial layer such as silicon, gallium arsenide, gallium nitride, silicon germanium, indium phosphide, etc. The conductive material 1202 is, for example, a metal such as polysilicon, aluminum, titanium nitride, titanium aluminum alloy, gold, tungsten, etc.

Figure 12D:
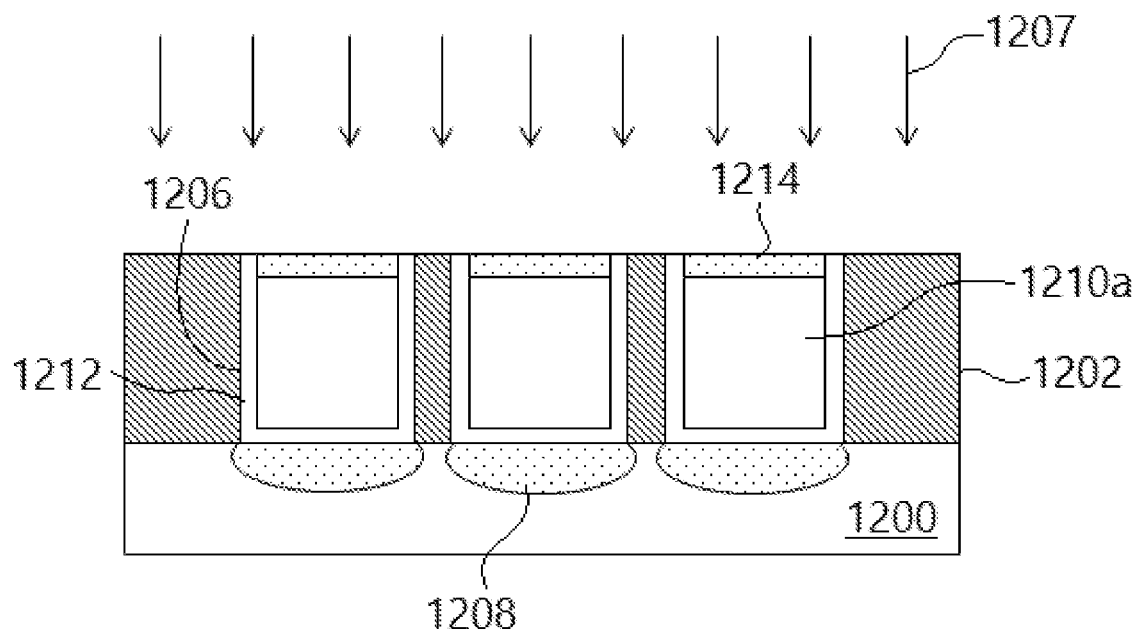

Then, referring to FIG. 12D, the channel material 1210 of FIG. 12C is planarized to remove the channel material outside the connected trench 1206, and form a multi-connected channel layer 1210a in the connected trench 1206. Moreover, the doping process 1207 may be performed according to a device design after the channel material is planarized, so as to form drain regions 1214 on a surface of the multi-connected channel layer 1210a.

Figure 12E:
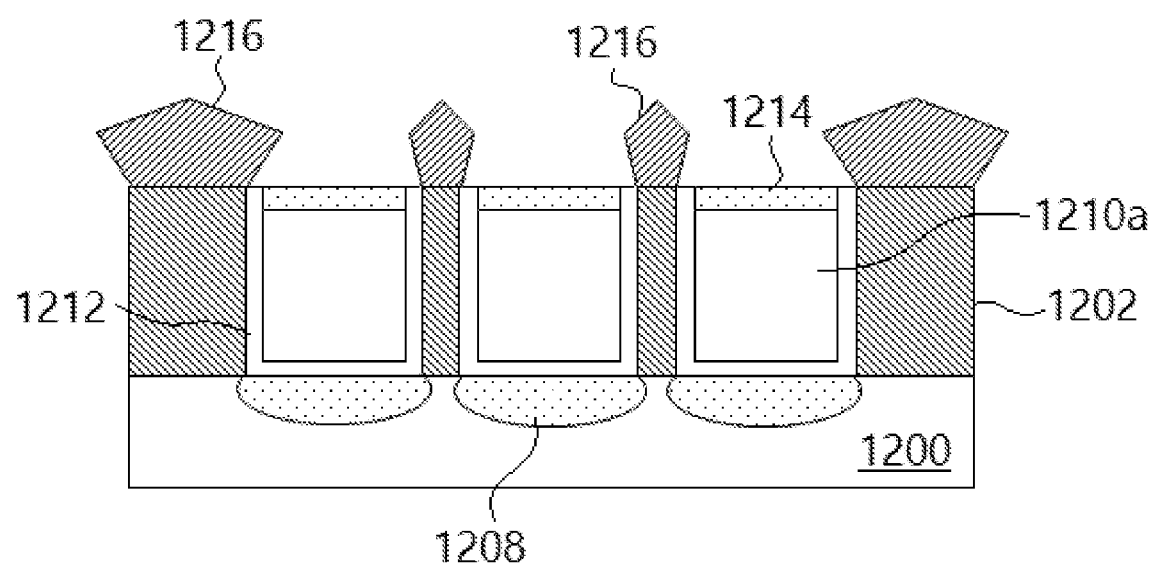

Finally, referring to FIG. 12E, the conductive material 1202 is metallized to form gate structures 1216.

Figure 13A:
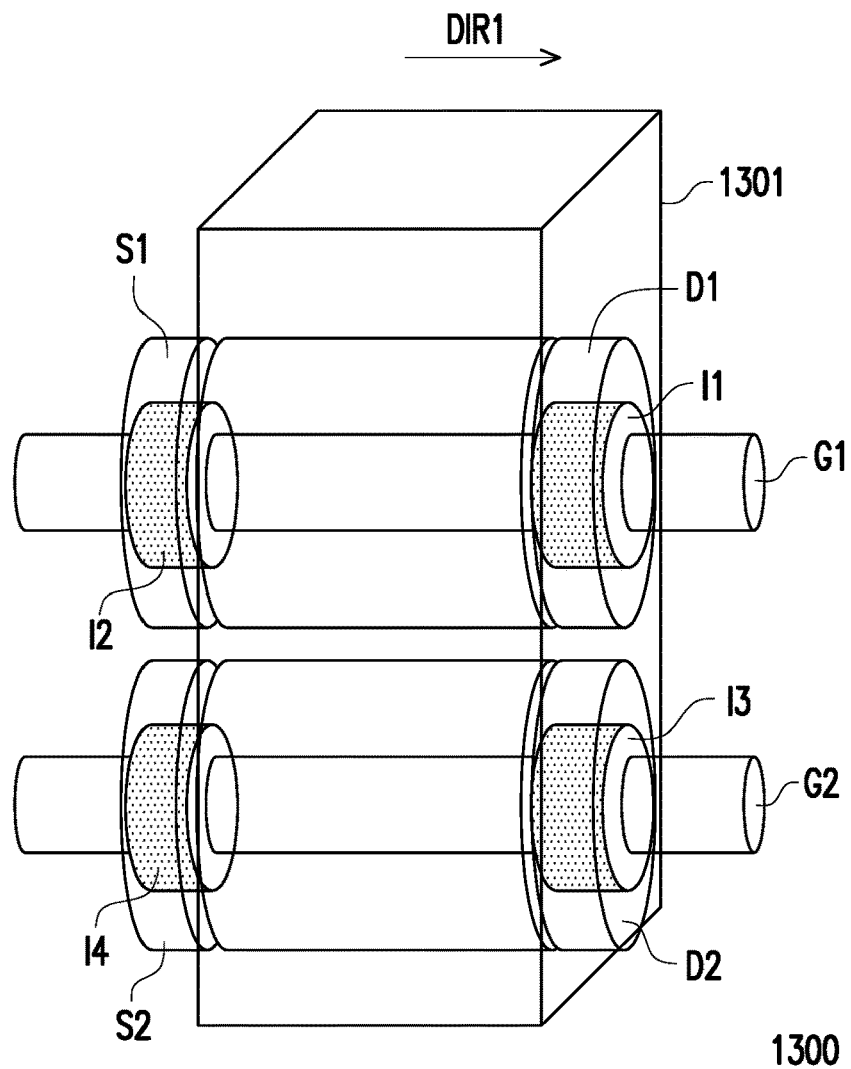
FIG. 13A is a schematic diagram of a circuit structure according to an embodiment of the disclosure.

Referring to FIG. 13A, FIG. 13A is a schematic diagram of a circuit structure according to an embodiment of the disclosure. The circuit structure 1300 includes gate structures G1, G2 and a multi-connected channel layer 1301. The gate structures G1, G2 have a same extension direction DIR1, the gate structures G1, G2 respectively have a first end and a second end. The gate structures G1, G2 are disposed in the multi-connected channel layer 1301, and the gate structures G1, G2 are fully surrounded by the multi-connected channel layer 1301. A drain region D1 is formed on the first end of the gate structure G1, and a source region S1 is formed on the second end of the gate structure G1. The drain region D1, the source region S1 and the gate structure G1 respectively have insulating spacers I1 and I2 there between. The insulating spacers I1 and I2 are used for preventing short circuit between the drain region D1 and the gate structure G1, and between the source region S1 and the gate structure G1. Moreover, a drain region D2 is formed on the first end of the gate structure G2, and a source region S2 is formed on the second end of the gate structure G2. The drain region D2, the source region S2 and the gate structure G2 respectively have insulating spacers I3 and I4 there between. The insulating spacers I3 and I4 are used for preventing short circuit between the drain region D2 and the gate structure G2, and between the source region S2 and the gate structure G2.

In the embodiment, the gate structure G1 and the multi-connected channel layer 1301 may form a first transistor in collaboration with the drain region D1 and the source region S1. The gate structure G2 and the multi-connected channel layer 1301 may form a second transistor in collaboration with the drain region D2 and the source region S2. A channel of the first transistor may be formed in the multi-connected channel layer 1301, and a channel of the second transistor may also be formed in the multi-connected channel layer 1301, too. In this way, channels of the first transistor and the second transistor may be electrically connected to each other.

Figure 13B:
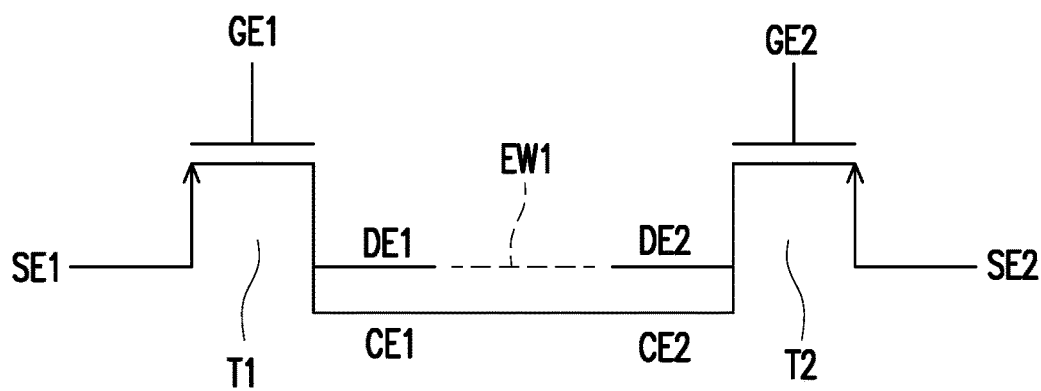
FIG. 13B is an equivalent circuit diagram of a circuit structure 1300.

Referring to FIG. 13A and FIG. 13B synchronously, FIG. 13B is an equivalent circuit diagram of the circuit structure 1300. In FIG. 13B, a first transistor T1 commonly formed by the gate structure G1 and the multi-connected channel layer 1301 may have four ends, which are respectively a gate end GE1, a source end SE1, a drain end DE1 and a channel end CE1. A second transistor T2 commonly formed by the gate structure G2 and the multi-connected channel layer 1301 may also have four ends, which are respectively a gate end GE2, a source end SE2, a drain end DE2 and a channel end CE2. Through the circuit structure 1300 shown in FIG. 13A, the transistors T1 and T2 may form an in-channel electrical connection structure through the channel ends CE1 and CE2 through the multi-connected channel layer 1301 shared by the transistors T1 and T2. In this way, the transistors T1 and T2 may form structures connected in series or parallel with each other. Moreover, through the mutual connection of the channel ends CE1 and CE2, charges in the channels of the transistors T1 and T2 may be transmitted under the condition of a relatively low transmission resistance, which may effectively improve signal transmission efficiency between the transistor T1 and T2.

On the other hand, in the circuit structure 1300, by short circuit the drain end DE1 of the transistor T1 and the channel end CE1 of the transistor T1, and short circuit the drain end DE2 of the transistor T2 and the channel end CE2 of the transistor T2, the channel end CE1 and the drain end DE1 of the transistor T1 and the channel end CE2 and the drain end DE2 of the transistor T2 may all be ends for draining charges. Moreover, in the embodiment of the disclosure, by using an external connecting wire EW1, the drain end DE1 and the drain end DE2 are electrically connected, so as to further improve the signal transmission efficiency between the transistors T1 and T2.

In the embodiment, the transistors T1 and T2 may be P-type transistors. The conductive types of the transistors T1 and T2 may be determined according to a conductive type of the multi-connected channel layer 1301 (the same with the conductive type of the multi-connected channel layer 1301). As the transistors T1 and T2 share the multi-connected channel layer 1301, the conductive types of the transistors T1 and T2 are the same. In other embodiment of the disclosure, the transistors T1 and T2 may also be N-type transistors.

Through the implementation of the aforementioned embodiment, the circuit structure 1300 of the embodiment of the disclosure may implement an in-channel logic structure.

Figure 14:
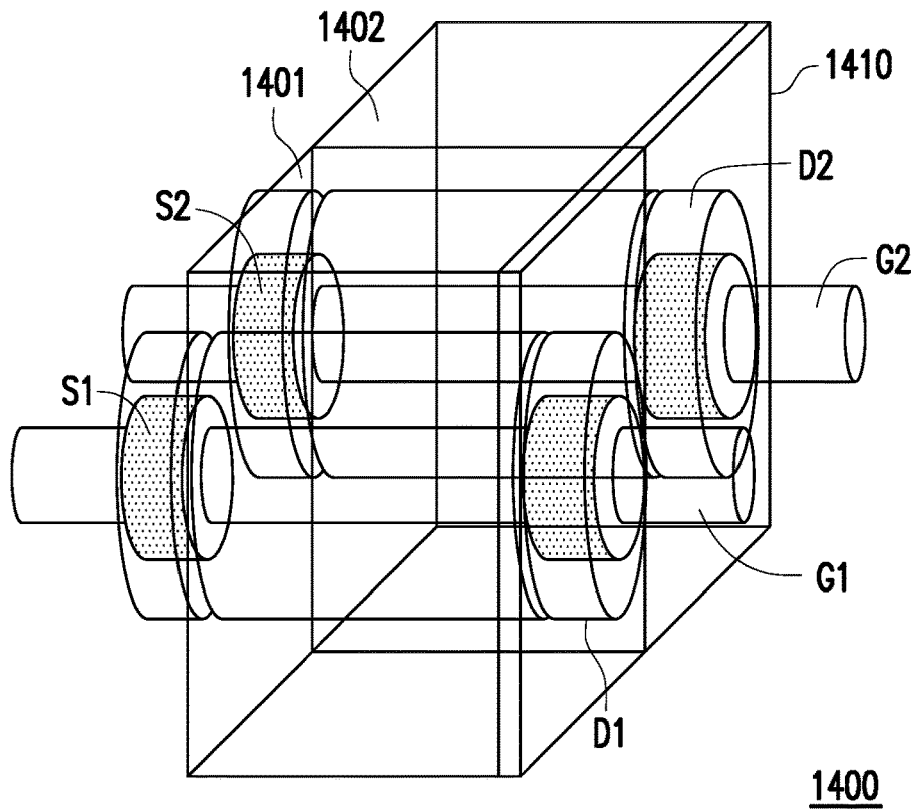
FIG. 14 is a schematic diagram of a circuit structure according to another embodiment of the disclosure.

Referring to FIG. 14, FIG. 14 is a schematic diagram of a circuit structure according to another embodiment of the disclosure. The circuit structure 1400 includes gate structures G1, G2, multi-connected channel layers 1401, 1402 and a wire layer 1410. The multi-connected channel layers 1401, 1402 respectively have different (complementary) conductive types, and respectively surround the gate structures G1 and G2. The gate structures G1 and G2 have a same extension direction. The source region S1 and the drain region D1 are respectively configured on a first end and a second end of the gate structure G1, and the source region S2 and the drain region D2 are respectively configured on a first end and a second end of the gate structure G2. Moreover, in the embodiment, the wire layer 1410 is configured to surround the drain region D1 and the drain region D2, and electrically connect to the drain region D1 and the drain region D2.

In the embodiment, the gate structure G1 and the multi-connected channel layer 1401 may form a first transistor, and the gate structure G2 and the multi-connected channel layer 1402 may form a second transistor. Moreover, by using the wire layer 1410 to electrically connect the drain region D1 and the drain region D2, the first transistor and the second transistor may be connected in a series connection or a parallel connection. It should be noted that by using the wire layer 1410 to electrically connect the drain region D1 and the drain region D2, channels of the first transistor and the second transistor may form a pseudo connection state, and form an in-channel logic structure.

Figure 15A:
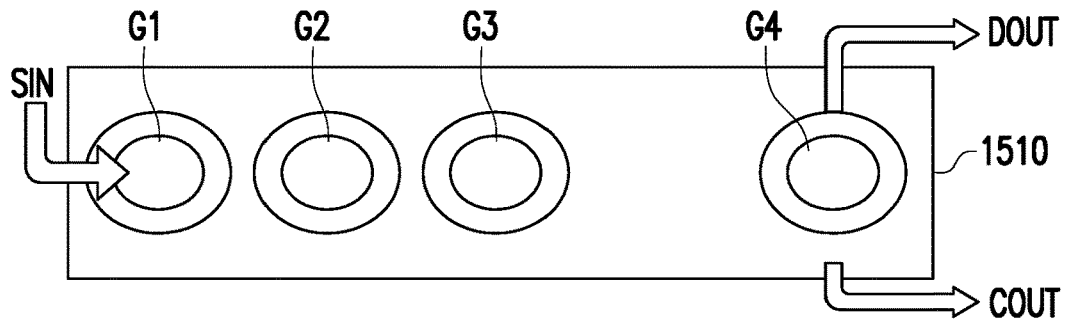
FIG. 15A is a top view of a circuit structure according to another embodiment of the disclosure.
Figure 15B:
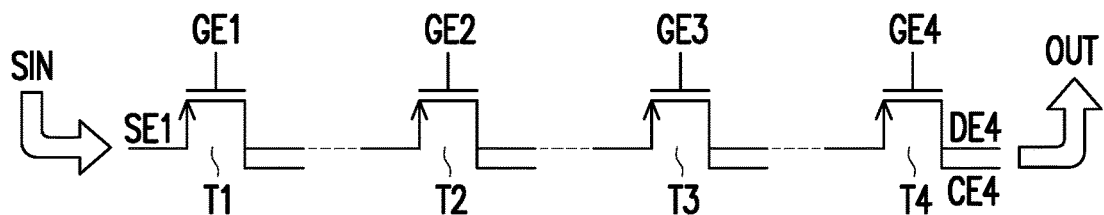
FIG. 15B is an equivalent circuit diagram of a circuit structure 1500.

Referring to FIG. 15A, FIG. 15A is a top view of a circuit structure according to another embodiment of the disclosure. The circuit structure 1500 includes a plurality of gate structures G1-G4 and a multi-connected channel layer 1510. The gate structures G1-G4 are disposed in the same multi-connected channel layer 1510, and the multi-connected channel layer 1510 surrounds the gate structures G1-G4. The gate structures G1-G4 and the multi-connected channel layer 1510 form a plurality of transistors connected in series with each other. A source region on the gates structure G1 is configured to receive a source input signal SIN, and a channel and a drain region on the gates structure G4 may respectively generate a channel output signal COUT and a drain output signal DOUT. Referring to an equivalent circuit diagram of the circuit structure 1500 of FIG. 15B, the gate structures G1-G4 and the multi-connected channel layer 1510 respectively form transistors T1-T4. By sharing the multi-connected channel layer 1510, the transistors T1-T4 may have a sequential serial connection configuration, where the transistors T1-T4 respectively have gate ends GE1-GE4 corresponding to the gate structures G1-G4, and the gate ends GE1-GE4 may be used for receiving the same or different control signals.

On the other hand, the source end SE1 of the transistor T1 may receive the source input signal SIN, and a channel end CE4 and a drain end DE4 of the transistor T4 may generate an output signal OUT. The output signal OUT may be any one of the channel output signal COUT and the drain output signal DOUT, or a combination of the channel output signal COUT and the drain output signal DOUT.

In the embodiment, the circuit structure 1500 may be a pass transistor logic (PTL), and implements signal transmission through in-channel charge transfer. Through the in-channel connection structure of the transistors T1-T4, a transmission resistance of the PTL is reduced, the efficiency of signal transmission is improved, and an IR drop distortion caused by an internal resistance is reduced.

Figure 16A:
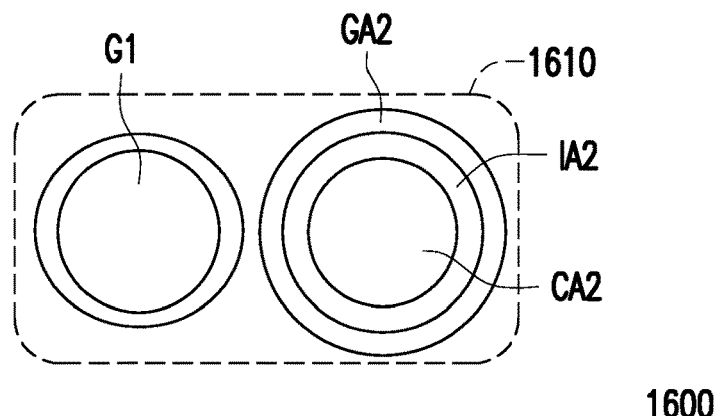
FIG. 16A is a top view of a circuit structure according to another embodiment of the disclosure.

Referring to FIG. 16A, FIG. 16A is a top view of a circuit structure according to another embodiment of the disclosure. The circuit structure 1600 includes gate structures G1, GA2 and a multi-connected channel layer 1610. The multi-connected channel layer 1610 fully surrounds the gate structures G1, GA2, and the gate structure GA2 has a closed area, and an insulating layer IA2 and an isolating channel layer CA2 are configured in the closed area, where the insulating layer IA2 is disposed between the gate structure GA2 and the isolating channel layer CA2 to prevent the gate structure GA2 and the isolating channel layer CA2 from direct short circuit. In the embodiment, the gate structure G1 and the multi-connected channel layer 1610 may form a first transistor, and the gate structure GA2, the insulating layer IA2 and the isolating channel layer CA2 may form a second transistor.

Figure 16B:
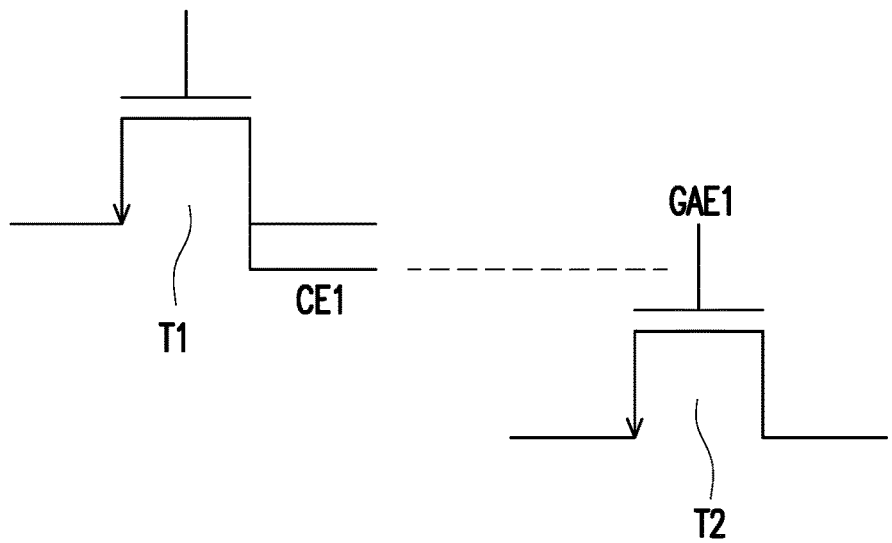
FIG. 16B and FIG. 16C are respectively equivalent circuit diagrams of different implementations of a circuit structure 1600.
Figure 16C:
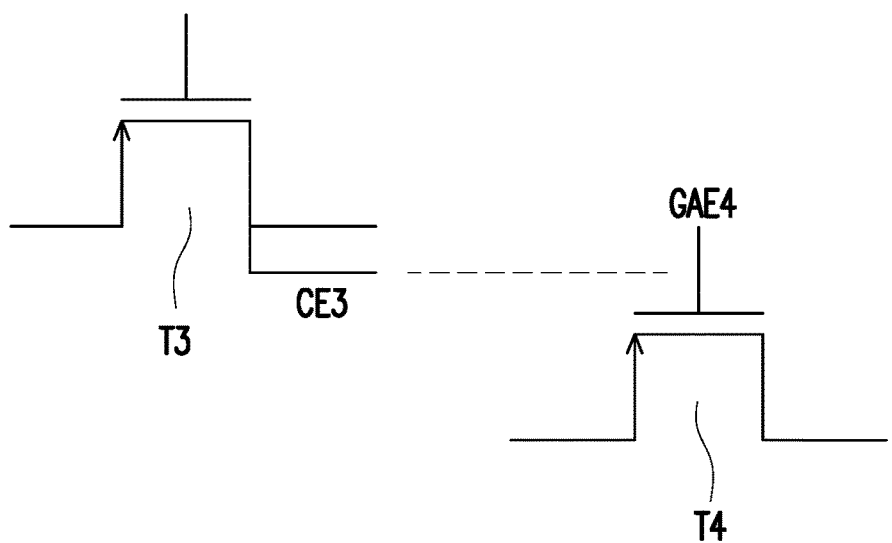

As the gate structure GA2 is directly disposed in the multi-connected channel layer 1610, and is fully surrounded by the multi-connected channel layer 1610, a channel of the first transistor may be directly and electrically connected to a gate end of the second transistor. Referring to FIG. 16B and FIG. 16C, FIG. 16B and FIG. 16C are respectively equivalent circuit diagrams of different implementations of the circuit structure 1600. In FIG. 16B, the gate structure G1 and the multi-connected channel layer 1610 form the first transistor T1, and the gate structure GA2 and the multi-connected channel layer 1610 form the second transistor T2. Based on the mutual contact between the gate structure GA2 and the multi-connected channel layer 1610, the channel end CE1 of the first transistor T1 may be directly and electrically connected to the gate end GAE1 of the second transistor T2. In this way, a transmission resistance between the channel end CE1 of the first transistor T1 and the gate end GAE1 of the second transistor T2 may be reduced to improve the signal transmission efficiency.

In the embodiment of FIG. 16A, conductive types of the multi-connected channel layer 1610 and the isolating channel layer CA2 may be the same, for example, the N-type. In this way, the first transistor T1 and the second transistor T2 in FIG. 16A may be N-type transistors. Comparatively, the conductive type of the multi-connected channel layer 1610 and the isolating channel layer CA2 may also be the P-type, as shown in FIG. 16C, a first transistor T3 formed by the gate structure G1 and the multi-connected channel layer 1610 and a second transistor T4 formed by the gate structure GA2 and the multi-connected channel layer 1610 may also be P-type transistors.

Moreover, in FIG. 16C, through the mutual contact between the gate structure GA2 and the multi-connected channel layer 1610, the channel end CE3 of the first transistor T3 may be directly and electrically connected to the gate end GAE4 of the second transistor T4. In this way, a transmission resistance between the channel end CE3 of the first transistor T3 and the gate end GAE4 of the second transistor T4 may be reduced to improve the signal transmission efficiency.

Figure 17A:
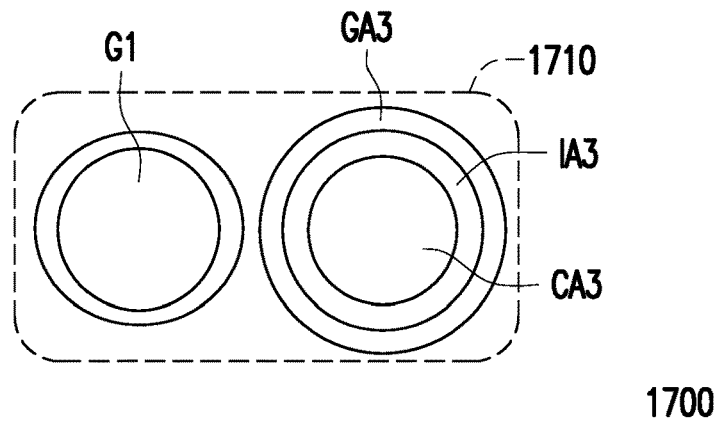
FIG. 17A is a top view of a circuit structure according to another embodiment of the disclosure.

Referring to FIG. 17A, FIG. 17A is a top view of a circuit structure according to another embodiment of the disclosure. The circuit structure 1700 includes gate structures G1, GA3 and a multi-connected channel layer 1710. The multi-connected channel layer 1710 fully surrounds the gate structures G1, GA3, and the gate structure GA3 has a closed area, and an insulating layer IA3 and an isolating channel layer CA3 are configured in the closed area, where the insulating layer IA3 is disposed between the gate structure GA3 and the isolating channel layer CA3 to prevent the gate structure GA3 and the isolating channel layer CA3 from direct short circuit. In the embodiment, the gate structure G1 and the multi-connected channel layer 1710 may form a first transistor, and the gate structure GA3, the insulating layer IA3 and the isolating channel layer CA3 may form a second transistor.

Figure 17B:
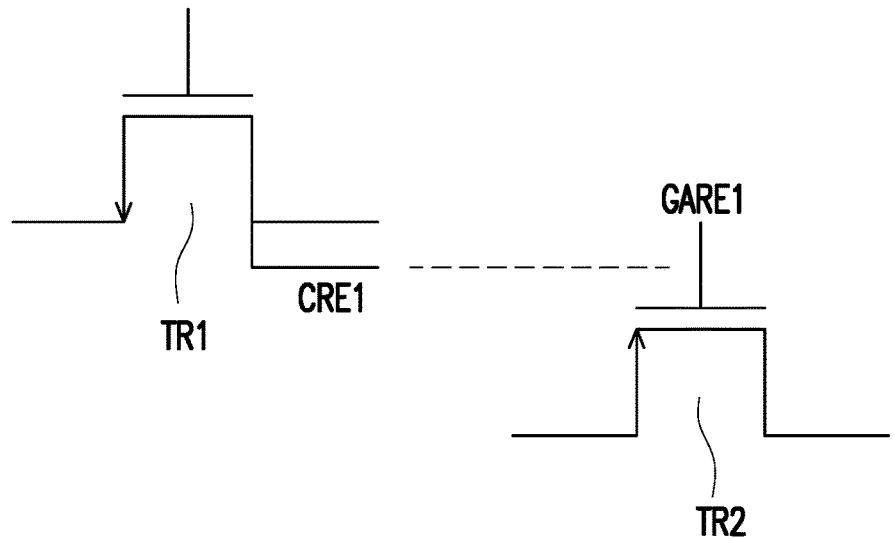
FIG. 17B and FIG. 17C are respectively equivalent circuit diagrams of different implementations of a circuit structure 1700.
Figure 17C:
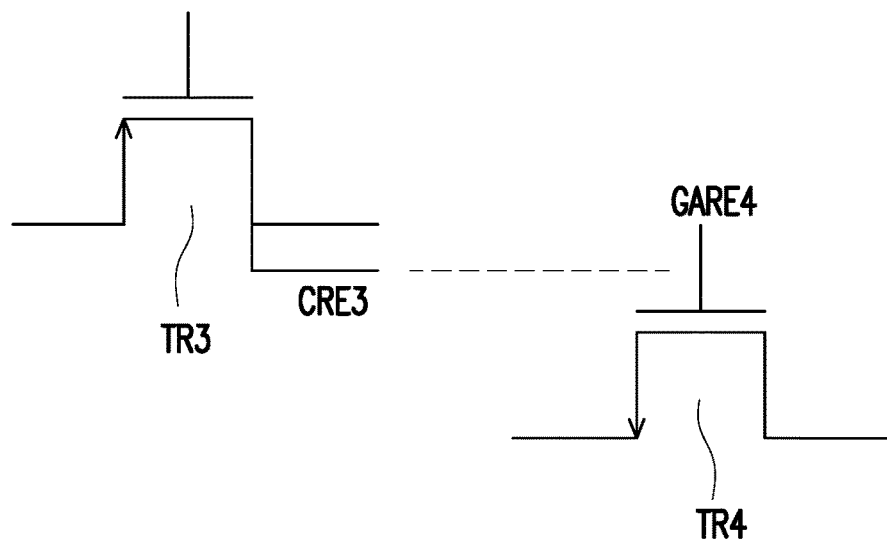

It should be noted that the conductive types of the multi-connected channel layer 1710 and the isolating channel layer CA3 may be opposite. Referring to FIG. 17A to FIG. 17C, FIG. 17B and FIG. 17C are respectively equivalent circuit diagrams of different implementations of the circuit structure 1700. Taking a situation that the conductive types of the multi-connected channel layer 1710 and the isolating channel layer CA3 are respectively the N-type and the P-type as an example, in FIG. 17B, a first transistor TR1 formed by the multi-connected channel layer 1710 and the gate structure G1 may be the N-type transistor, and a second transistor TR2 formed by the gate structure GA3, the insulating layer IA3 and the isolating channel layer CA3 may be the P-type transistor. Moreover, through the mutual contact between the multi-connected channel layer 1710 and the gate structure GA3, the channel end CER1 of the first transistor TR1 may be directly and electrically connected to the gate end GARE1 of the second transistor TR2.

On the other hand, taking a situation that the conductive types of the multi-connected channel layer 1710 and the isolating channel layer CA3 are respectively the P-type and the N-type as an example, in FIG. 17C, a first transistor TR3 formed by the multi-connected channel layer 1710 and the gate structure G1 may be the P-type transistor, and a second transistor TR4 formed by the gate structure GA4, the insulating layer IA4 and the isolating channel layer CA4 may be the N-type transistor. Moreover, through the mutual contact between the multi-connected channel layer 1710 and the gate structure GA4, the channel end CER3 of the first transistor TR3 may be directly and electrically connected to the gate end GARE4 of the second transistor TR4.

Referring to FIG. 18A to FIG. 18C, FIG. 18A to FIG. 18C are schematic diagrams of a plurality of implementations of a circuit structure according to an embodiment of the disclosure. The circuit structures of FIG. 18A to FIG. 18C are restoring logic circuits. In FIG. 18A, the circuit structure 1810 includes a first transistor T1 and a second transistor T2. The first transistor T1 has a gate end GE1, a source end SE1, a drain end DE1 and a channel end CE1. The second transistor T2 has a gate end GE2, a source end SE2, a drain end DE2 and a channel end CE2. In the embodiment, the circuit structure 1810 is an inverter circuit, where the first transistor T1 may be a P-type transistor, and the second transistor T2 may be an N-type transistor. The source end SE1 of the first transistor T1 receives an operating voltage VDD, the gate end SE1 of the first transistor T1 receives an input signal IN, and the drain end DE1 and the channel end CE1 of the first transistor T1 may be electrically connected to the drain end DE2 and the channel end CE2 of the second transistor T2 at a zone Z1 by means of configuring an external wire. Moreover, the gate end SE2 of the second transistor T2 receives the input signal IN, and the source end SE2 of the second transistor T2 is coupled to a reference ground voltage VSS. Moreover, the channel end CE1 of the first transistor T1 and the channel end CE2 of the second transistor T2 are electrically connected, and generate the channel output signal COUT. The drain end DE1 of the first transistor T1 and the drain end DE2 of the second transistor T2 are electrically connected, and generate the drain output signal DOUT.

It should be noted that in the embodiment, the drain end DE1 and the channel end CE1 of the first transistor T1 may be electrically connected with each other, and the drain end DE2 and the channel end CE2 of the second transistor T2 may be electrically connected with each other to make the channel output signal COUT the same as the drain output signal DOUT.

In the embodiment, the input signal IN, the channel output signal COUT and the drain output signal DOUT may all be logic signals, and the circuit structure 1810 is an inverter logic circuit, and the input signal IN is inverted to the channel output signal COUT and the drain output signal DOUT.

Since the conductive types of the first transistor T1 and the second transistor T2 are opposite, the embodiment may be implemented by the circuit structure 1400.

In FIG. 18B, the circuit structure 1820 includes a first transistor T1, a second transistor T2, a third transistor T3 and a fourth transistor T4. The source end SE1 of the first transistor T1 and the source end SE2 of the second transistor T2 commonly receive the operating voltage VDD, and the gate end GE1 of the first transistor T1 and the gate end GE2 of the second transistor T2 respectively receive input signals IN1 and IN2. The channel end CE1 of the first transistor T1 and the channel end CE2 of the second transistor T2 commonly generate the channel output signal COUT, and the drain end DE1 of the first transistor T1 and the drain end DE2 of the second transistor T2 commonly generate the drain output signal DOUT. The first transistor T1 and the second transistor T2 present a parallel connection state.

Moreover, the channel end CE3 and the drain end DE3 of the third transistor T3 are respectively coupled to the channel end CE1 and the drain end DE1 of the first transistor T1, and the gate end GE3 of the third transistor T3 receives the input signal IN2. At least one of the channel end CE4 and the drain end DE4 of the fourth transistor T4 may be electrically connected to the source end SE3 of the third transistor T3 through wires configured in a zone Z2. Moreover, the source end SE4 of the fourth transistor receives the reference ground voltage VSS, and the gate end GE4 of the fourth transistor T4 receives the input signal IN1. The third transistor T3 and the fourth transistor T4 present a serial connection state, and in other embodiments of the disclosure, positions of the third transistor T3 and the fourth transistor may be exchanged.

The circuit structure 1820 is a NAND gate logic circuit, which is configured to execute a NAND logic operation on the input signals IN1 and IN2, so as to generate the channel output signal COUT and the drain output signal DOUT.

In FIG. 18C, the circuit structure 1830 includes a first transistor T1, a second transistor T2, a third transistor T3 and a fourth transistor T4. The first transistor T1 and the second transistor T2 are coupled in series with each other, and the third transistor T3 and the fourth transistor T4 are coupled in parallel with each other. It should be noted that the channel end CE1 and the drain end DE1 of the first transistor T1 may be electrically connected to the source end SE2 of the second transistor T2 through wires configured in a zone Z3. The circuit structure 1830 is a NOR gate logic circuit, and is configured to execute a NOR logic operation on the input signals IN1 and IN2, so as to generate the channel output signal COUT and the drain output signal DOUT.

It should be noted that in the embodiments of FIG. 18B and FIG. 18C, since the first transistor T1 and the second transistor T2 are transistors with the same conductive type (the P-type), the circuit structure 1300 of the aforementioned embodiment may be used for implementation. Since the first transistor T3 and the second transistor T4 are transistors with the same conductive type (the N-type), the circuit structure 1300 of the aforementioned embodiment may also be used for implementation. Since the conductive type of the first transistor T1 is opposite to the conductive type of the third transistor T3, the multi-connected channel layer used for constructing the first transistor T1 and the second transistor T2 is different to the multi-connected channel layer used for constructing the third transistor T3 and the fourth transistor T4, and may be constructed through the circuit structure 1400.

Figure 19A:
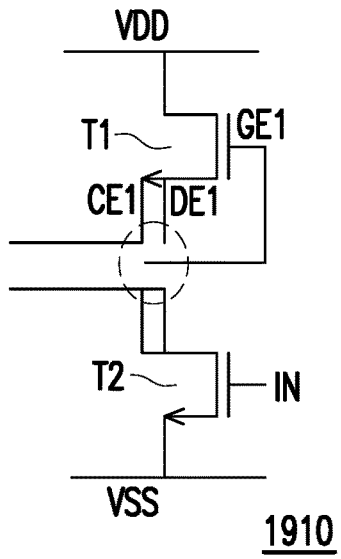
FIG. 19A to FIG. 19C are schematic diagrams of a plurality of implementations of a circuit structure according to an embodiment of the disclosure.
Figure 19B:
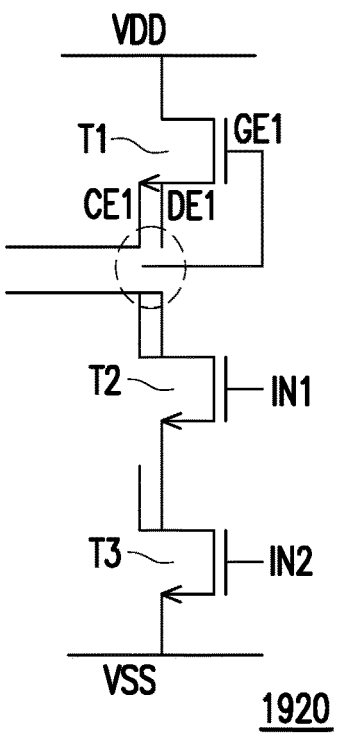
Figure 19C:
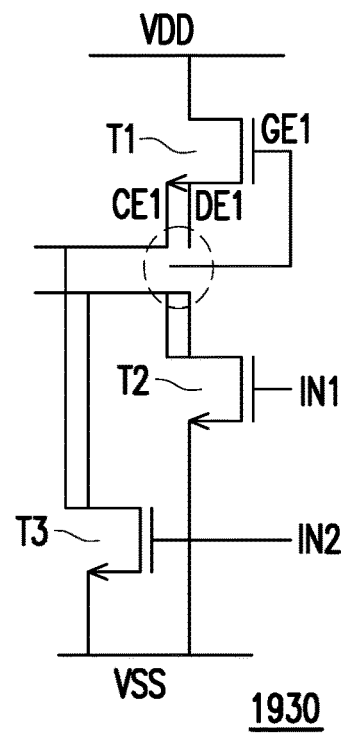

Referring to FIG. 19A to FIG. 19C, FIG. 19A to FIG. 19C are schematic diagrams of a plurality of implementations of a circuit structure according to an embodiment of the disclosure. The circuit structures 1910, 1920 and 1930 of the embodiment of FIG. 19A to FIG. 19C are respectively an inverter logic circuit, a NAND gate logic circuit and a NOR gate logic circuit. It should be noted that in the circuit structure 1910, 1920 and 1930, the first transistor T1 is configured to form a diode, where by coupling the gate end GE1 (through wires in the zones Z1-Z3) of the first transistor T1 to at least one of the channel end CE1 and the drain end DE1 thereof, the first transistor T1 forms a diode configuration, and serves as a pull-up circuit.

In FIG. 19B, the second transistor T2 and the third transistor T3 are coupled in series with each other, and respectively receive the input signals IN1 and IN2. In this way, in collaboration with the first transistor T1 receiving the operating voltage VDD, the circuit structure 1920 may be a NAND logic circuit.

In FIG. 19C, the second transistor T2 and the third transistor T3 are coupled in parallel with each other, and respectively receive the input signals IN1 and IN2. In this way, in collaboration with the first transistor T1 receiving the operating voltage VDD, the circuit structure 1930 may be a NOR logic circuit.

Figure 20:
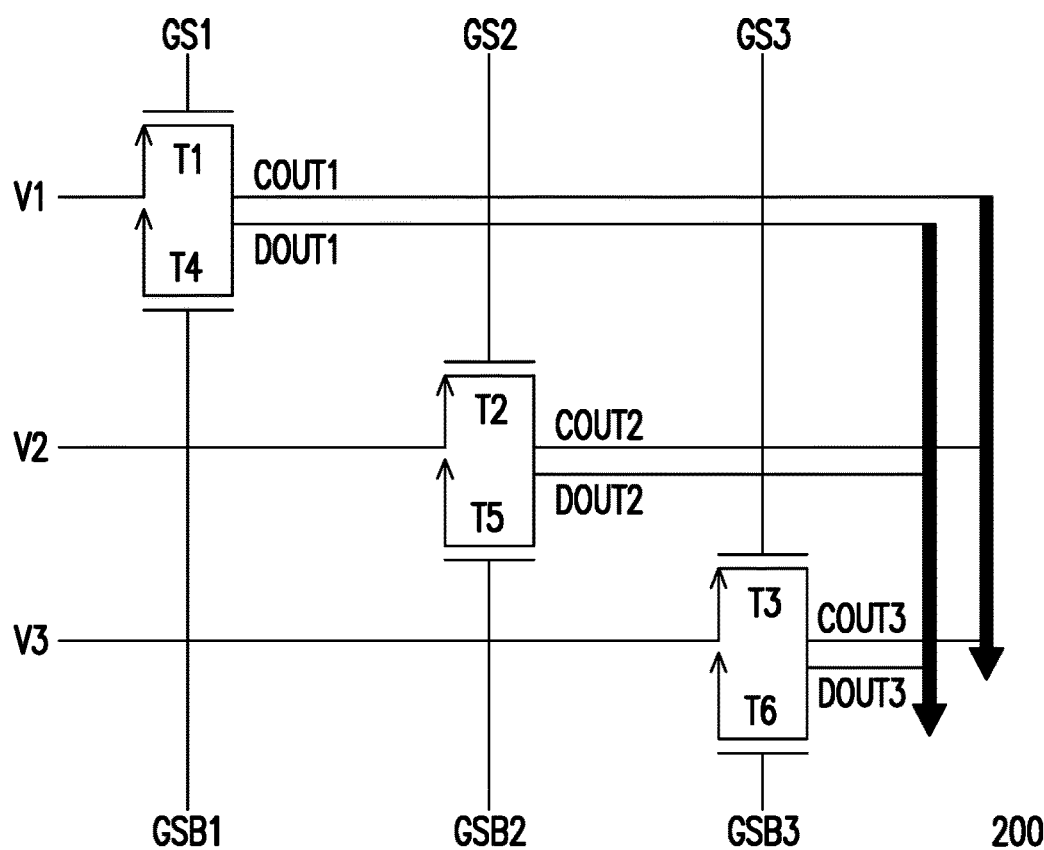
FIG. 20 is a schematic diagram of an implementation of a circuit structure of the disclosure.

Referring to FIG. 20, FIG. 20 is a schematic diagram of an implementation of a circuit structure of the disclosure. The circuit structure 2000 includes a first transistor T1 to a sixth transistor T6. The first transistor T1 to the third transistor T3 have the same conductive type (the P-type), and the fourth transistor T4 to the sixth transistor T6 have the same conductive type (the N-type). The source ends of the first transistor T1 and the fourth transistor T4 are electrically connected with each other, and the channel ends and the drain ends of the first transistor T1 and the fourth transistor T4 are electrically connected with each other. The gate ends of the first transistor T1 and the fourth transistor T4 respectively receive a control signal GS1 and a control signal GS1B, where the control signal GS1 and the control signal GS1B are signals inverted with each other. The source ends of the second transistor T2 and the fifth transistor T5 are electrically connected with each other, and the channel ends and the drain ends of the second transistor T2 and the fifth transistor T5 are electrically connected with each other. The gate ends of the second transistor T2 and the fifth transistor T5 respectively receive a control signal GS2 and a control signal GS2B, where the control signal GS2 and the control signal GS2B are signals inverted with each other. Moreover, the source ends of the third transistor T3 and the sixth transistor T6 are electrically connected with each other, and the channel ends and the drain ends of the third transistor T3 and the sixth transistor T6 are electrically connected with each other. The gate ends of the third transistor T3 and the sixth transistor T6 respectively receive a control signal GS3 and a control signal GS3B, where the control signal GS3 and the control signal GS3B are signals inverted with each other.

In the embodiment, the circuit structure 2000 is a switch type logic circuit. The mutually coupled transistor pairs respectively form a transmission gate, and are configured to transmit signals V1-V3 to respectively generate channel output signals COUT1-COUT3 and drain output signals DOUT1-DOUT3.

In the embodiment, since the first transistor T1 to the third transistor T3 have the same conductive type, the first transistor T1 to the third transistor T3 may be constructed by sharing a same first multi-connected channel layer according to the circuit structure 1300. Since the fourth transistor T4 to the sixth transistor T6 have the same conductive type, the fourth transistor T4 to the sixth transistor T6 may be constructed by sharing a same second multi-connected channel layer according to the circuit structure 1300. The first multi-connected channel layer and the second multi-connected channel layer have different conductive types, and may be constructed according to the circuit structure 1400.

Figure 21A:
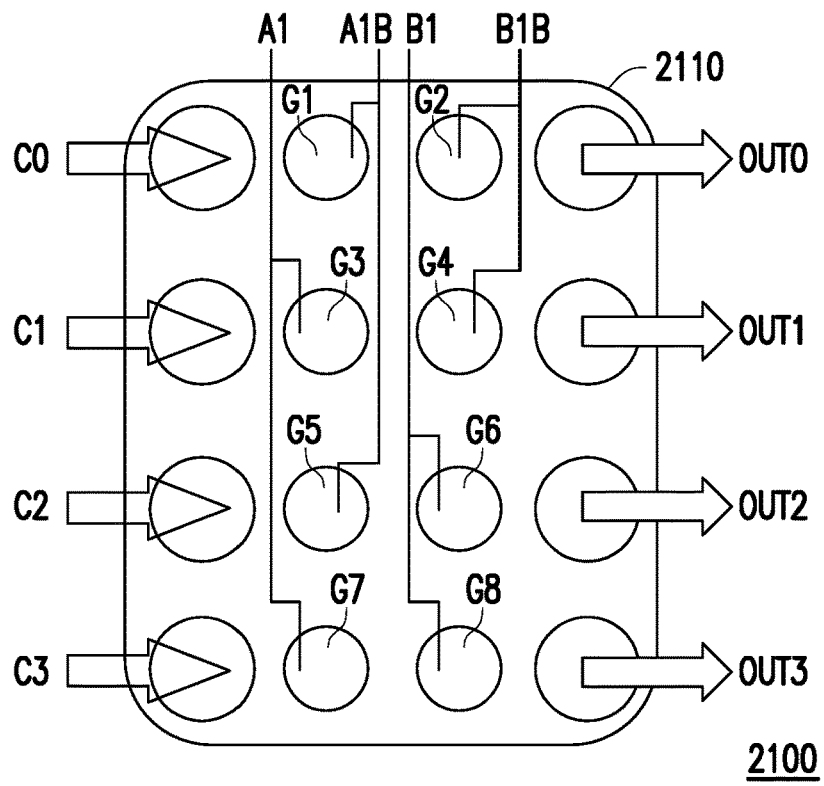
FIG. 21A is a top view of an implementation of a circuit structure of the disclosure.
Figure 21B:
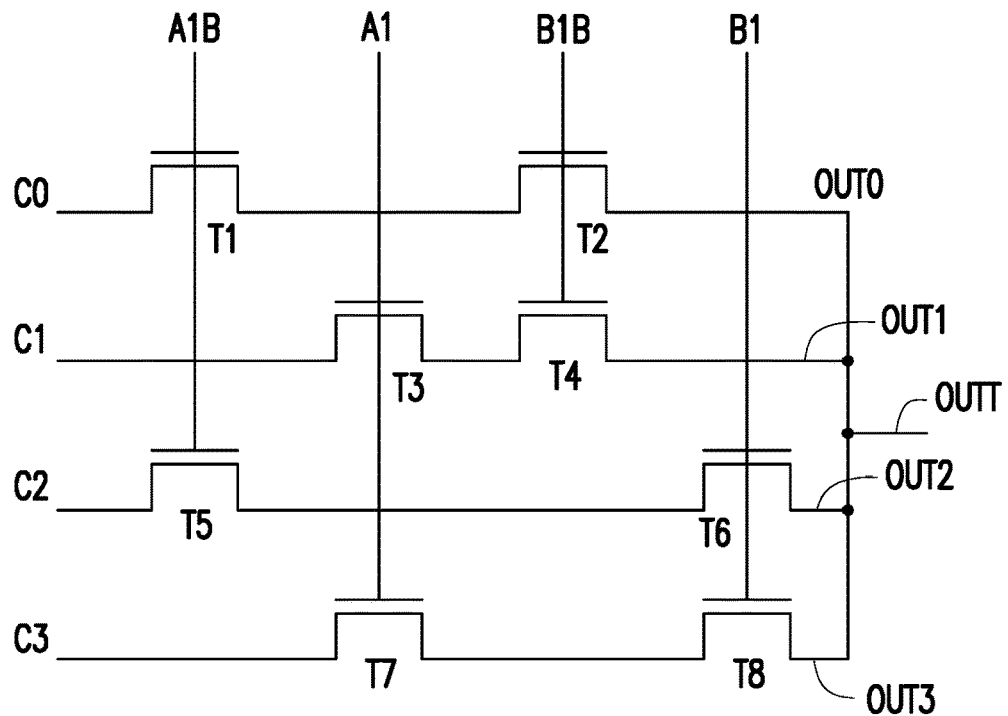
FIG. 21B is an equivalent circuit diagram of a circuit structure 2100.

Referring to FIG. 21A and FIG. 21B, FIG. 21A is a top view of an implementation of a circuit structure of the disclosure, and FIG. 21B is an equivalent circuit diagram of the circuit structure 2100. In FIG. 21A, the circuit structure 2100 includes a multi-connected channel layer 2110 and a plurality of gate structures G1-G8. The multi-connected channel layer 2110 fully surrounds the gate structures G1-G8. The gate structures G1, G3, G5 and G7 are respectively arranged corresponding to the gate structures G2, G4, G6, and G8.

Moreover, the gate structures G3 and G7 receive a signal A1; the gate structures G1 and G5 receive a signal A1B; the gate structures G6 and G8 receive a signal B1; and the gate structures G2 and G4 receive a signal B1B, where the signal A1 is an inverted signal of the signal A1B, the signal B1 is an inverted signal of the signal B1B. In collaboration with the multi-connected channel layer 2110, the gate structures G1-G8 may respectively form a first transistor T1 to an eighth transistor T8 (shown in FIG. 21B). A source end of the transistor T1 is configured to receive an input signal C0; a source end of the transistor T3 is configured to receive an input signal C1; a source end of the transistor 15 is configured to receive an input signal C2; and a source end of the transistor T7 is configured to receive an input signal C3.

Taking a situation that the first to the eighth transistors T1-T8 are all N-type transistors as an example, when the signals A1B and B1B have a logic high level (the signals A1 and B1 have a logic low level), the first transistor T1 and the second transistor T2 generate channels, and form an in-channel connection through the channels, and transmit the input signal C0 to generate an output signal OUT0. When the signals A1 and B1B have the logic high level (the signals A1B and B1 have the logic low level), the third transistor T3 and the fourth transistor T4 generate channels, and form an in-channel connection through the channels, and transmit the input signal C1 to generate an output signal OUT1. When the signals A1B and B1 have the logic high level (the signals A1 and B1B have the logic low level), the fifth transistor T5 and the sixth transistor T6 generate channels, and form an in-channel connection through the channels, and transmit the input signal C2 to generate an output signal OUT2. When the signals A1 and B1 have the logic high level (the signals A1B and B1B have the logic low level), the seventh transistor T7 and the eighth transistor T8 generate channels, and form an in-channel connection through the channels, and transmit the input signal C3 to generate an output signal OUT3.

Moreover, in the embodiment, by electrically connecting the drain ends and/or the channel ends of the transistors T2, T4, T6 and T8, the output signals OUT0-OUT3 are combined to generate an output signal OUTT.

Figure 22:
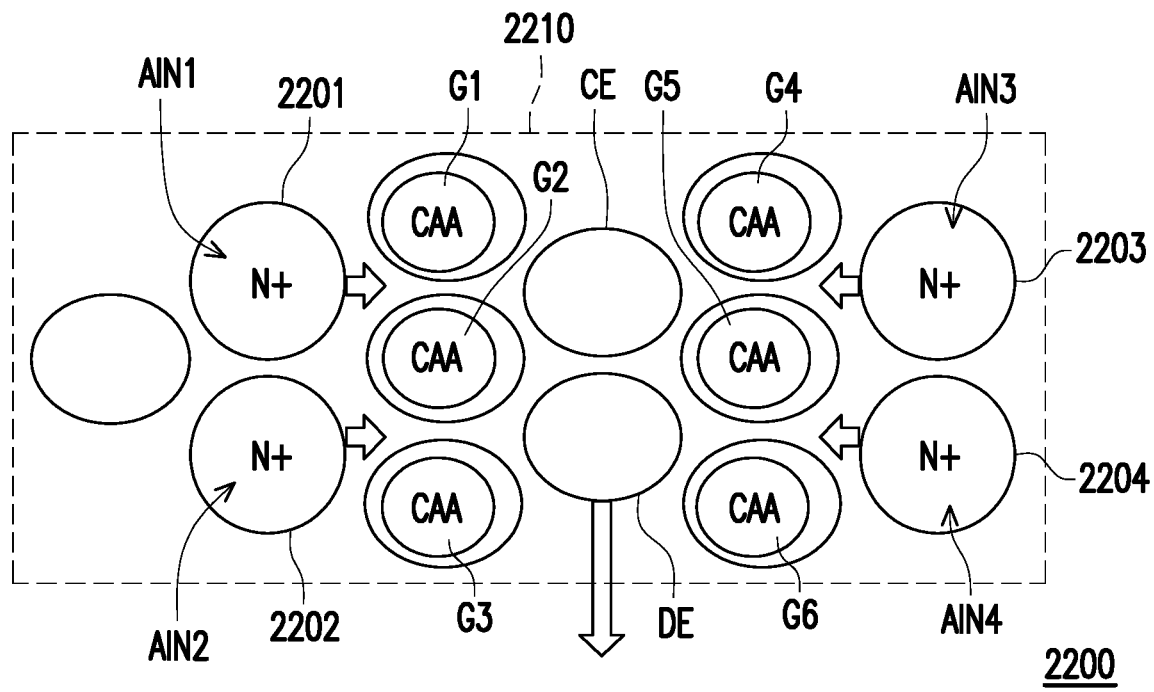
FIG. 22 is a top view of an implementation of a circuit structure of the disclosure.

Referring to FIG. 22, FIG. 22 is a top view of an implementation of a circuit structure of the disclosure. The circuit structure 2200 includes a plurality of gate structures G1-G6 and a multi-connected channel layer 2210. The multi-connected channel layer 2210 fully surrounds the gate structures G1-G6, the gate structures G1-G6 are configured to form a plurality of transistors, and the transistors have a common channel end CE and a common drain end DE. The gate structures G1-G6 are arranged in symmetrical manner relative to the channel end CE and the drain end DE.

The multi-connected channel layer 2210 is configured with a plurality of N-enhanced (N+) doped regions 2201-2204 to serve as signal receiving interfaces respectively receiving a plurality of input signals AIN1-AIN4. In the embodiment, the circuit structure 2200 is an analog circuit, and the input signals AIN1-AIN4 are all analog signals. Moreover, the input signals AIN1~AIN4 may be two sets of differential signals, for example, the input signals AIN1 and AIN2 are one set of differential signals, and the input signals AIN3 and AIN4 are another set of differential signals.

Figure 23:
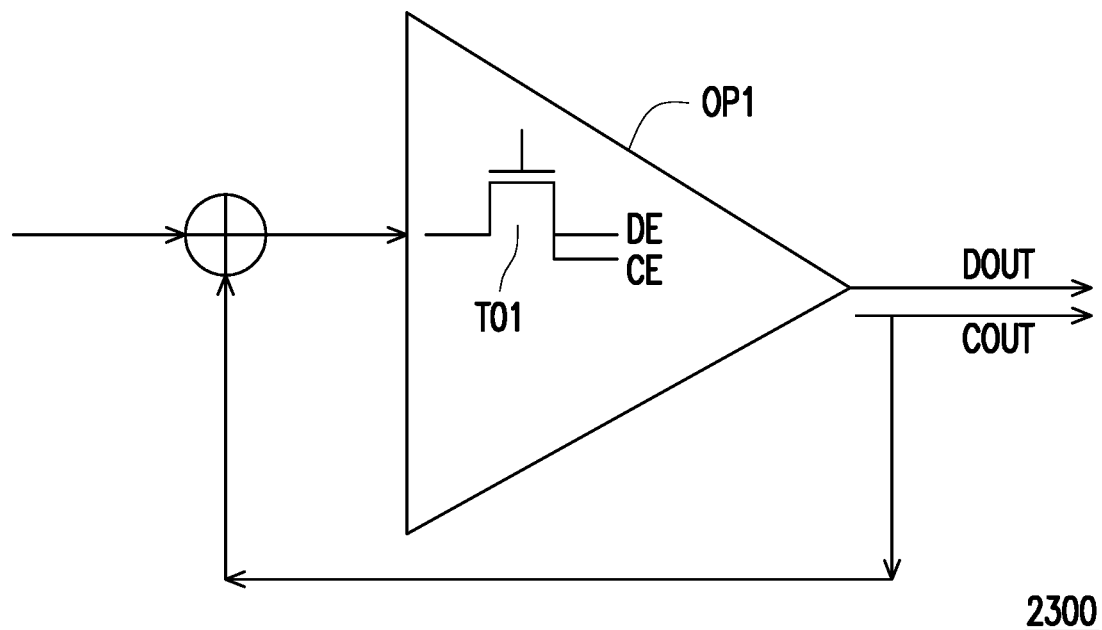
FIG. 23 is a circuit diagram of an implementation of a circuit structure of the disclosure.

Referring to FIG. 23, FIG. 23 is a circuit diagram of an implementation of a circuit structure of the disclosure. Based on the transistor structure provided by the embodiment of the disclosure, the circuit structure 2300 may construct an output stage of an operational amplifier OP1 by using a transistor TO1 the channel end CE and the drain end DE. In this way, through a feedback operation performed based on in-channel feedback of the channel output signal COUT provided by the channel end CE of the transistor TO1, a transmission resistance of a signal feedback path may be reduced and quality of the feedback signal is improved. Moreover, the drain end DE of the transistor TO1 may be configured to provide the drain output signal DOUT to an external circuit. In this way, interference of the feedback signal (the channel output signal COUT) caused by the external circuit is reduced, so as to improve circuit stability.

Figure 24:
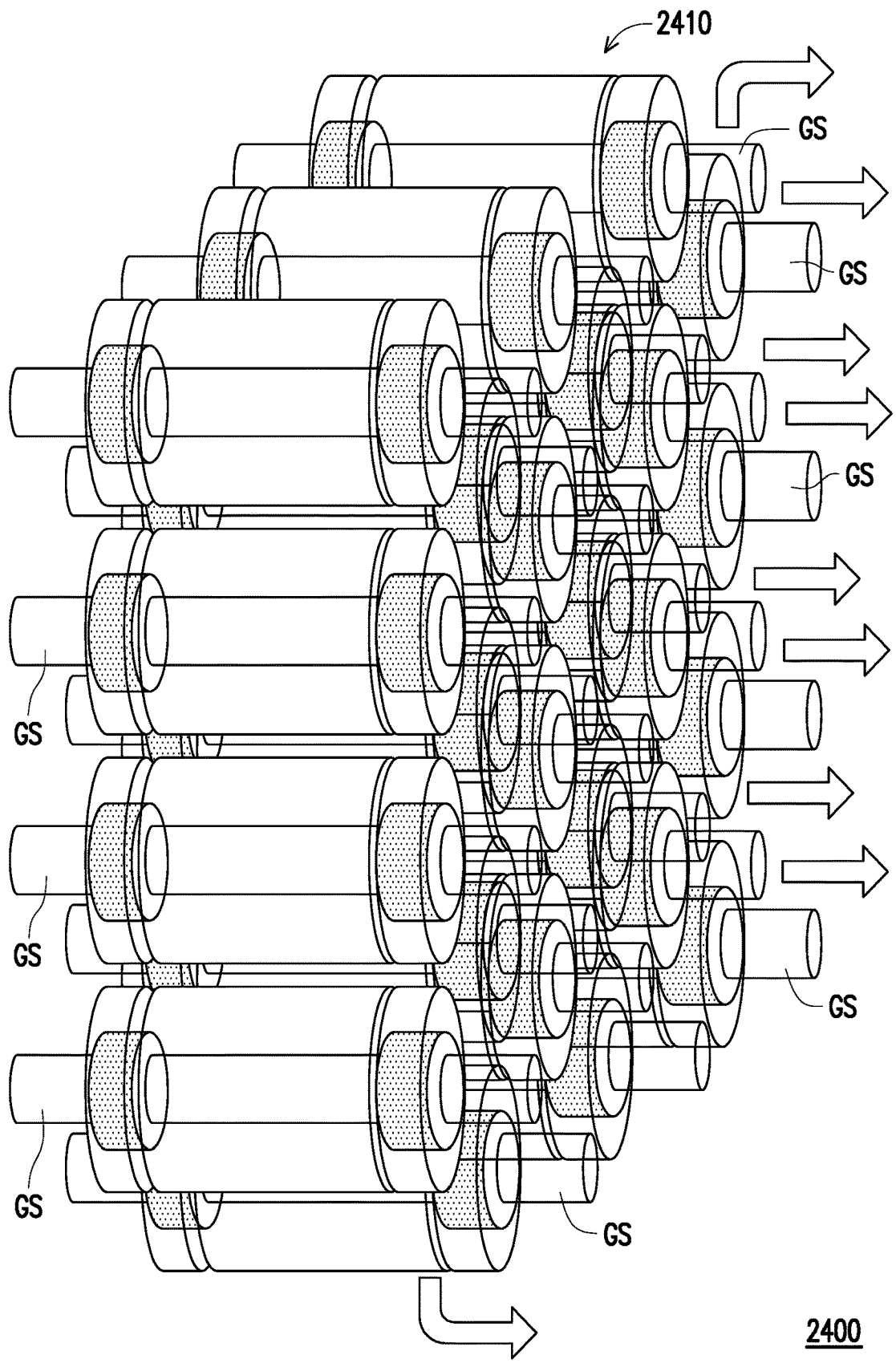
FIG. 24 is a three-dimensional structural diagram of an implementation of a circuit structure of the disclosure.

Referring to FIG. 24, FIG. 24 is a three-dimensional structural diagram of an implementation of a circuit structure of the disclosure. In the circuit structure 2400, a plurality of gate structures GS is configured in a multi-connected channel layer 2410, and the gate structures GS are arranged in an array. The circuit structure 2400 may form a power transistor, and generate a plurality of parallel channels through the plurality of gate structures GS and the multi-connected channel layer 2410. The circuit structure 2400 may provide a plurality of channel output signals through the plurality of channels, and provides a plurality of drain output signals through the drain ends of the plurality of transistors. In this way, driving ability of the channel output signals and the drain output signals may be improved.

Figure 25:
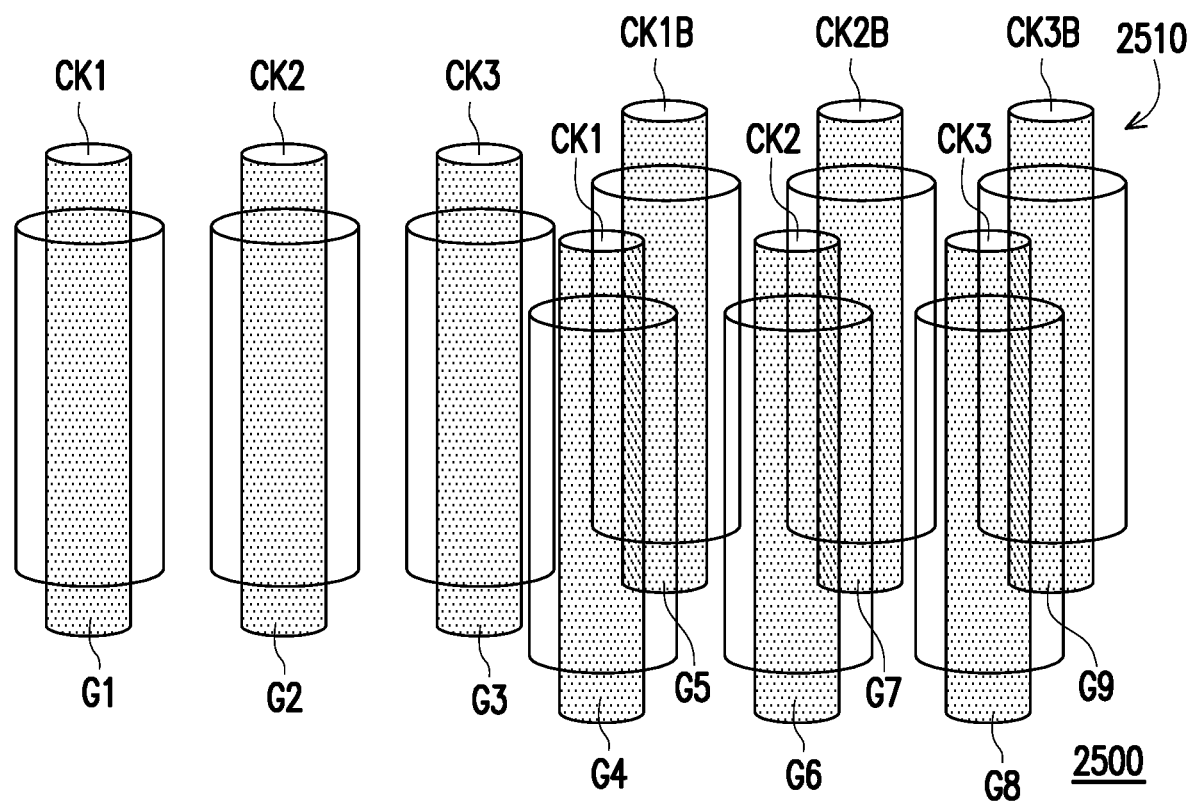
FIG. 25 is a three-dimensional structural diagram of an implementation of a circuit structure of the disclosure.

Referring to FIG. 25, FIG. 25 is a three-dimensional structural diagram of an implementation of a circuit structure of the disclosure. The circuit structure 2500 includes a multi-connected channel layer 2510 and a plurality of gate structures G1-G9. The gate structures G1-G9 are configured in the multi-connected channel layer 2510, and the multi-connected channel layer 2510 fully surrounds the gate structures G1-G9. The gate structures G1-G9 cooperate with the multi-connected channel layer 2510 to form a plurality of transistors, and in the embodiment, the gate structures G1 and G4 receive a clock signal CK1; the gate structures G2 and G6 receive a clock signal CK2; the gate structures G3 and G8 receive a clock signal CK3; the gate structures G5, G7 and G9 respectively receive clock signals CK1B, CK2B and CK3B. The clock signals CK1B, CK2B and CK3B are respectively inverted signals of the clock signals CK1, CK2 and CK3, and the clock signals CK1, CK2 and CK3 may be periodic signals that are sequentially enabled.

The circuit structure 2500 may be a charge transfer circuit, and may be used for implementing a charge pump circuit, which is an analog switching power supply.

It should be noted that in the embodiment, by sharing the same multi-connected channel layer 2510, the plurality of channels of the plurality of formed transistors may implement a charge transfer operation in an in-channel connection manner. Under the benefit of a relatively low transmission resistance, conversion efficiency of charge transfer may be improved.

Figure 26:
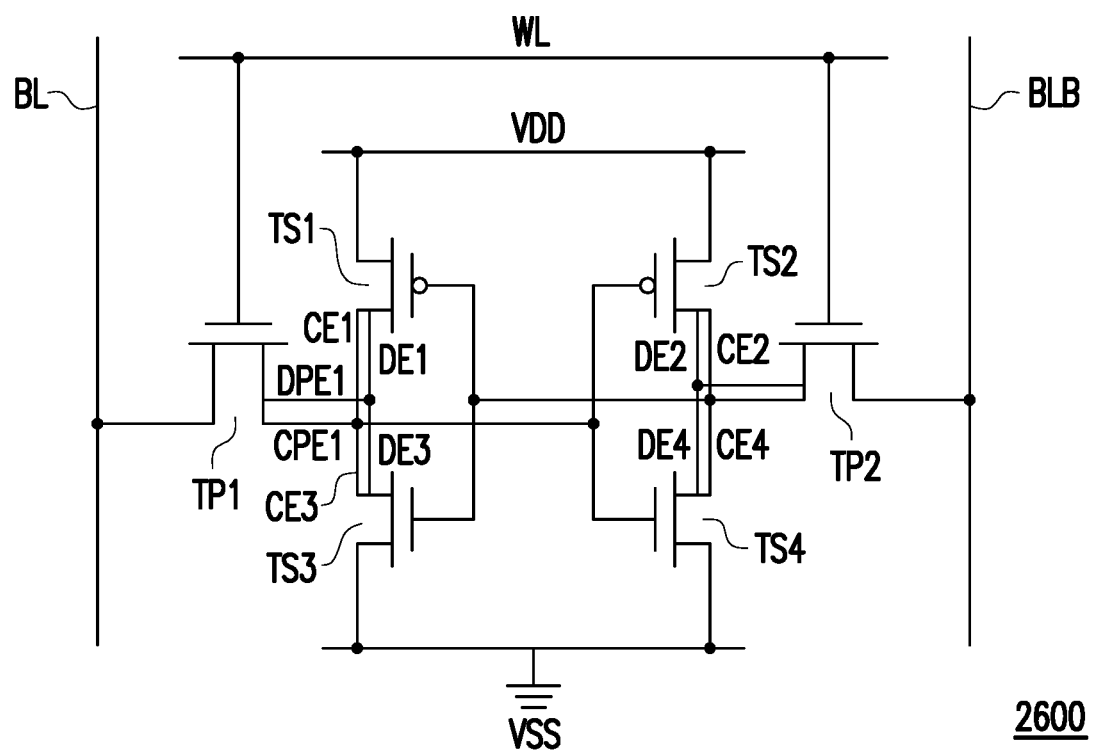
FIG. 26 is a circuit diagram of an implementation of a circuit structure of the disclosure.

Referring to FIG. 26, FIG. 26 is a circuit diagram of an implementation of a circuit structure of the disclosure. The circuit structure 2600 is a memory circuit (for example, a static memory cell). The circuit structure 2600 includes transistors TS1-TS4 and TP1, TP2. The transistors TS1 and TS2 are P-type transistors, and commonly receive the operating voltage VDD. The transistors TS3 and TS4 are N-type transistors, and are respectively coupled in series with the transistors TS1 and TS2. The transistors TS3 and TS4 receive the reference ground voltage VSS. Moreover, gate ends of the transistors TS1 and TS3 are commonly coupled to channel ends CE2 and CE4 of the transistors TS2 and TS4, and/or coupled to drain ends DE2 and DE4 of the transistors TS2 and TS4. Gate ends of the transistors TS2 and TS4 are commonly coupled to channel ends CE1 and CE3 of the transistors TS1 and TS3, and/or coupled to drain ends DE1 and DE3 of the transistors TS1 and TS3.

On the other hand, a gate end of the transistor TP1 is coupled to a word line WL, a source end of the transistor TP1 is coupled to a bit line BL, and the transistor TP1 is coupled to the channel ends CE1, CE3 and the drain ends DE1, DE3 of the transistors TS1 and TS3 through a channel end CPE1 and/or a drain end DPE1 thereof. A gate end of the transistor TP2 is coupled to the word line WL, a source end of the transistor TP2 is coupled to a bit line BLB, and the transistor TP2 is coupled to the channel ends CE2, CE4 and the drain ends DE2, DE4 of the transistors TS2 and TS4 through a channel end CPE2 and/or a drain end DPE2 thereof.

It should be noted that a connection method of the transistors TP1 and TP2 is not limited to that shown in FIG. 26. The transistors TP1 and TP2 may also be respectively coupled to the bit lines BL, BLB through the channel ends CE2, CE4 and the Drain ends DE2, DE4.

In the embodiment, though the in-channel connection manner, the transistors TS1-TS4, TP1 and TP2 may improve a charge storage efficiency to ensure data stability.

In summary, in the circuit structure of the disclosure, by designing the channel outside the gate of the channel all-around semiconductor device, the channel is not confined in a single gate structure, but has multiple current paths in a three-dimensional space. If the circuit structure is applied to the field effect transistor, an output current per unit area may be greatly increased at a same sub-threshold swing, so that it is expected that device density may be further increased.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A channel all-around semiconductor device, comprising:
    a plurality of gate structures, wherein the gate structures have the same extension direction, and each of the gate structures comprises a first end and a second end opposite to each other; and
    a multi-connected channel layer, wherein the gate structures are all surrounded by the multi-connected channel layer, and a plane direction of the multi-connected channel layer is perpendicular to the extension direction of the plurality of gate structures, so that channels of the gate structures are connected to each other.

2. The channel all-around semiconductor device according to claim 1, wherein a spacing between the gate structures is less than a distance between the first end and the second end of each of the gate structures, and the spacing is a distance between two of the gate structures perpendicular to the extension direction.

3. The channel all-around semiconductor device according to claim 1, wherein a cross section of each of the gate structures is a circle, an ellipse, a rectangle, a cross shape, a polygon or an irregular shape, and the cross section is perpendicular to the extension direction.

4. The channel all-around semiconductor device according to claim 1, further comprising a dielectric layer disposed between each of the gate structures and the multi-connected channel layer.

5. The channel all-around semiconductor device according to claim 1, further comprising:

a source region and a drain region, which respectively surround the first end and the second end of each of the gate structures; and a plurality of insulated isolation layers respectively disposed between the source region and the gate structure as well as disposed between the drain region and the gate structure, wherein each of the gate structures and the multi-connected channel layer form a P-N junction.

6. The channel all-around semiconductor device according to claim 5, wherein a spacing between the gate structures is within one time of a distance between the source region and the drain region, and the spacing is a distance between two of the gate structures perpendicular to the extension direction.

7. The channel all-around semiconductor device according to claim 5, wherein an area of a cross section of the drain region is less than an area of a plane of the multi-connected channel layer, and the cross section is perpendicular to the extension direction.

8. The channel all-around semiconductor device according to claim 1, further comprising:

a source region and a drain region, which respectively surround the first end and the second end of each of the gate structures; and a plurality of insulated isolation layers respectively disposed between the source region and the gate structure as well as disposed between the drain region and the gate structure, wherein each of the gate structures and the multi-connected channel layer form a metal-semiconductor contact.

9. The channel all-around semiconductor device according to claim 1, further comprising:

a source region and a drain region, which respectively surround the first end and the second end of each of the gate structures;

a plurality of insulated isolation layers respectively disposed between the source region and the gate structure as well as disposed between the drain region and the gate structure; and a heterostructure, disposed between each of the gate structures and the multi-connected channel layer, wherein the heterostructure is an undoped heterostructure or a modulation-doped heterostructure.

10. The channel all-around semiconductor device according to claim 1, wherein each of the gate structures is a hollow structure, and the semiconductor device further comprises:

an internally sealed channel structure formed in a hollow region of each of the gate structures;

a source region and a drain region, which respectively surround the first end and the second end of each of the gate structures; and a plurality of insulated isolation layers respectively disposed between the source region and the gate structure as well as disposed between the drain region and the gate structure.

11. The channel all-around semiconductor device according to claim 1, further comprising:

a source region and a drain region, which respectively surround the first end and the second end of each of the gate structures;

a plurality of insulated isolation layers respectively disposed between the source region and the gate structure as well as disposed between the drain region and the gate structure; and a gate insulating layer disposed between each of the gate structures and the multi-connected channel layer.

12. The channel all-around semiconductor device according to claim 11, wherein a thickness of the insulated isolation layer is greater than or equal to a thickness of the gate insulating layer.

13. The channel all-around semiconductor device according to claim 1, further comprising:

a source region and a drain region, which respectively surround the first end and the second end of each of the gate structures, wherein the source region and the drain region are different conductivity types;

a plurality of insulated isolation layers respectively disposed between the source region and the gate structure as well as disposed between the drain region and the gate structure;

a gate insulating layer disposed between each of the gate structures and the multi-connected channel layer; and a pocket doped region, which is disposed in each source region and surrounds each of the gate structures, wherein the pocket doped region and the source region are different conductivity types.

14. The channel all-around semiconductor device according to claim 1, wherein an arrangement of the plurality of gate structures in the plane direction is a paired arrangement, a regular arrangement or an irregular arrangement.

15. The channel all-around semiconductor device according to claim 14, wherein the regular arrangement comprises a triangular arrangement, a quadrilateral arrangement, a pentagonal arrangement or a hexagonal arrangement.

16. The channel all-around semiconductor device according to claim 1, further comprising at least one gate all-around device arranged in the multi-connected channel layer, wherein an extension direction of the gate all-around device is the same as the extension direction of the plurality of gate structures.

17. The channel all-around semiconductor device according to claim 1, wherein a portion of the gate structures is extended out of the multi-connected channel layer along the plane direction.

18. The channel all-around semiconductor device according to claim 1, wherein the gate structures are gate structures of different devices, and the gate structures of different devices are blocked through current or potential.

* * * * *